(12) United States Patent
Tanaka

(10) Patent No.: US 6,304,385 B1
(45) Date of Patent: Oct. 16, 2001

(54) LASER IRRADIATION APPARATUS AND METHOD

(75) Inventor: Koichiro Tanaka, Kanagawa (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 0 days.

(21) Appl. No.: 09/542,430

(22) Filed: Apr. 4, 2000

Related U.S. Application Data

(62) Division of application No. 09/049,735, filed on Mar. 26, 1998, now Pat. No. 6,104,535.

(30) Foreign Application Priority Data

Mar. 27, 1997 (JP) .................................................... 9-094605

(51) Int. Cl.[7] .................................................. G02B 27/10
(52) U.S. Cl. ........................ 359/619; 359/618; 359/628; 359/710
(58) Field of Search ................................... 359/618–619, 359/621–626, 628, 710; 362/259, 268; 219/121.73, 121.75

(56) References Cited

U.S. PATENT DOCUMENTS

| | | | |
|---|---|---|---|
| 4,733,944 | * | 3/1988 | Fahlen et al. .......................... 359/624 |
| 5,815,494 | * | 9/1998 | Yamazaki et al. ....................... 372/25 |
| 5,900,980 | * | 5/1999 | Yamazaki et al. ...................... 359/619 |
| 5,932,118 | * | 8/1999 | Yamamoto et al. ............. 219/121.66 |
| 5,959,779 | * | 9/1999 | Yamazaki et al. ..................... 359/624 |

FOREIGN PATENT DOCUMENTS 6-244104   9/1994   (JP) .

* cited by examiner

Primary Examiner—Jordan M. Schwartz
(74) Attorney, Agent, or Firm—Fish & Richardson P.C.

(57) ABSTRACT

Where an object is irradiated and scanned with laser beams that have been shaped into a linear shape and are moved in their width direction, a cylindrical lens group that is used in an optical system has a cylindrical face having an interior angle X that is not equal to 90°. As a result, peaks of light interference can be prevented from being superimposed on each other, whereby striped irradiation unevenness formed in the longitudinal direction of the linear laser beams can be lowered.

22 Claims, 19 Drawing Sheets

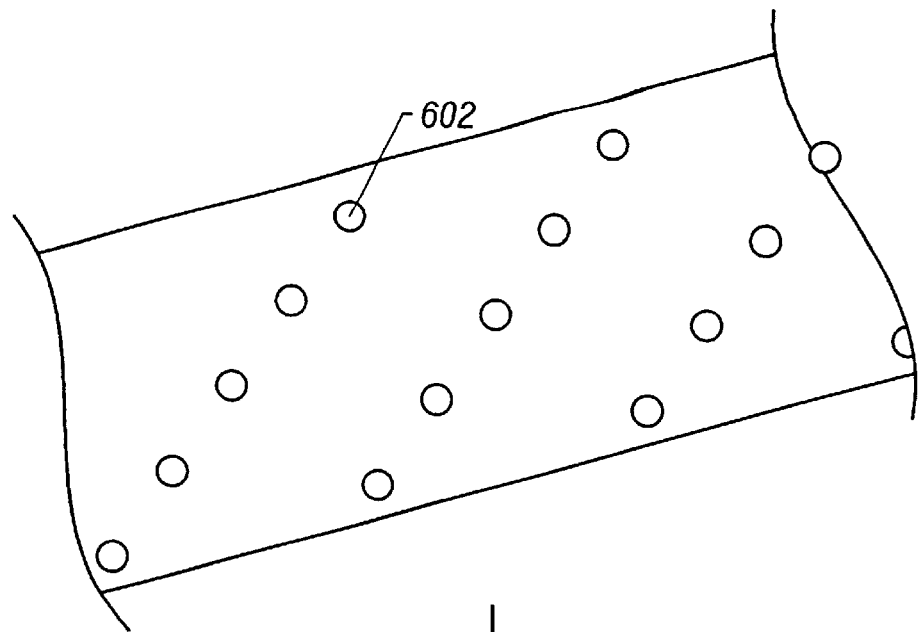
FIG. 18A
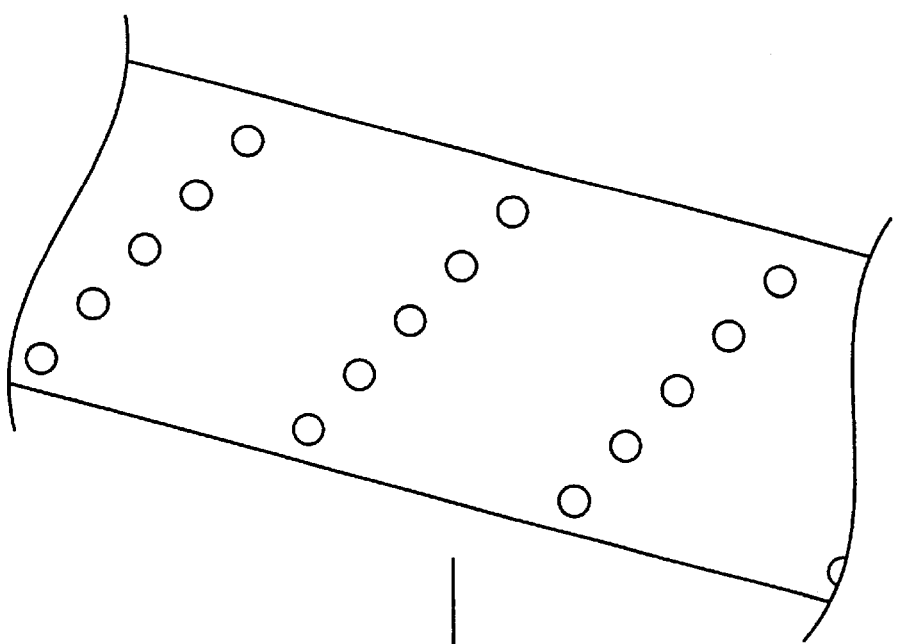
FIG. 18B

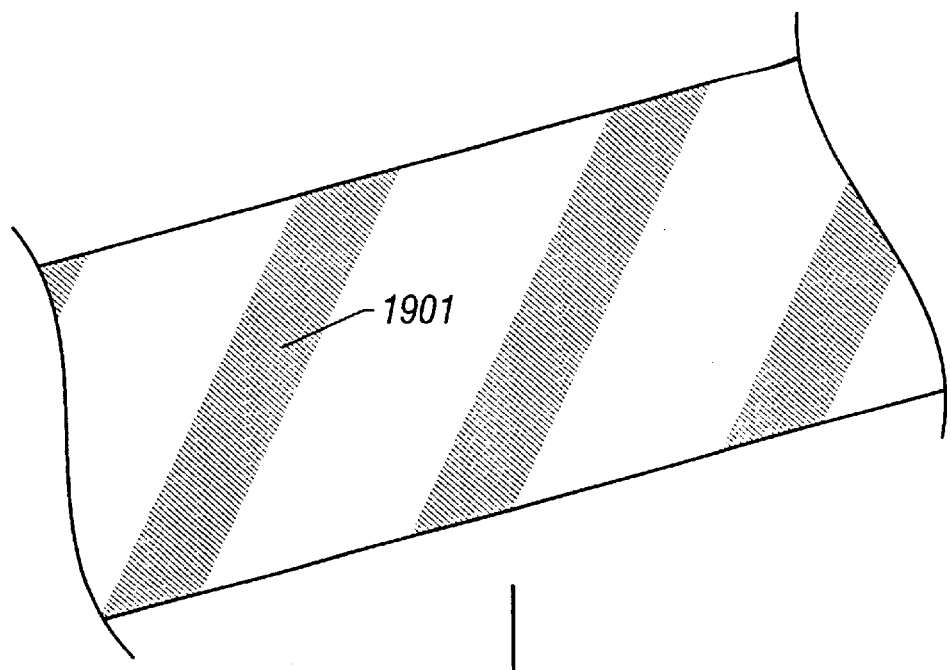
FIG. 21A
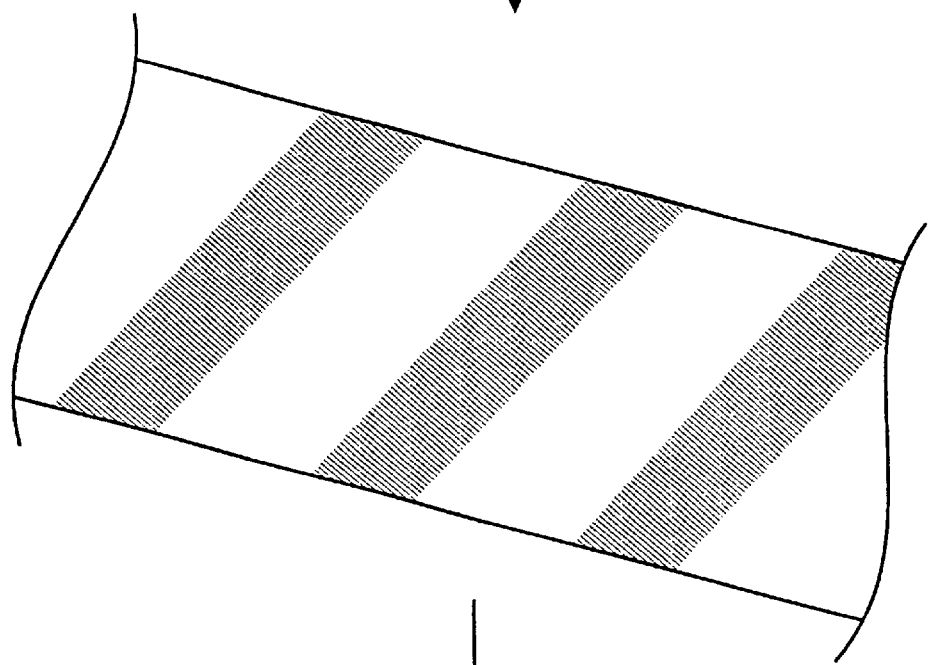
FIG. 21B

LASER IRRADIATION APPARATUS AND METHOD

This is a divisional of U.S. application Ser. No. 09/049,735, filed Mar. 26, 1998 now U.S. Pat. No. 6,104,535.

BACKGROUND OF THE INVENTION

1. Field of the Invention

The present invention relates to a laser irradiation technique. For example, the invention relates to a technique of performing annealing or the like on a semiconductor film by irradiating it with a laser light.

2. Description of the Related Art

In recent years, techniques of crystallizing or improving the crystallinity of a non-single-crystal semiconductor film such as an amorphous semiconductor film or a crystalline semiconductor film (i.e., a non-single-crystal, crystalline semiconductor film such as a polycrystalline or microcrystalline semiconductor film) formed on an insulative substrate such as a glass substrate through laser annealing have been studied extensively. Silicon films are commonly used as such semiconductor films. The glass substrate is less expensive than and superior in workability to the quartz substrate that is widely used conventionally, and has an advantage that a large-area substrate can be produced easily. These are reasons for the above-mentioned studies. The reason why the laser is preferred for crystallization is that the glass substrate has a low melting point. The laser can supply high energy only to a non-single-crystal film without changing the temperature of a substrate much.

A crystalline silicon film formed by laser annealing has high mobility, and hence is widely used in, for instance, the monolithic liquid crystal electro-optical device in which thin-film transistors (TFTs) for pixel and TFTs for driver circuits are formed on a single glass substrate by using the crystalline silicon film. In general, a crystalline silicon film is called a polysilicon film because it is made up of a number of crystal grains.

Having high mass-productivity and being superior from the industrial viewpoint, a laser annealing method is preferred in which a pulse laser beam emitted from a high-power power excimer laser or the like is shaped by an optical system into a several-centimeter-square spot or a line that is several millimeters wide and tens of centimeters long on the irradiation surface and the irradiation surface is scanned with the laser beam (the laser beam irradiation position is moved relatively to the irradiation surface).

In particular, the use of a linear laser beam provides high productivity because the entire irradiation surface can be irradiated with laser light by a scan only in the direction perpendicular to the longitudinal direction of the linear laser beam. This is in contrast to the case of using a spot-like laser beam which requires scans in two orthogonal directions. The reason why the scan is performed perpendicularly to the longitudinal direction of the linear laser beam is that this scanning direction is most efficient. Because of the high productivity, the use of a linear laser beam in laser annealing is now becoming the mainstream.

The technique of performing laser annealing on a non-single-crystal semiconductor film by scanning it with a pulse laser beam that has been modified into a linear shape has several problems. Among those problems, one of the particularly serious problems is that the laser annealing effect is not uniform over the entire film surface. At the stage when a linear laser beam started to be used, a phenomenon that stripes appeared at overlaps of beams was remarkable and a film exhibited marked differences in semiconductor characteristics between those stripes (see FIG. 1A).

For example, if a liquid crystal display is produced by using a film having such stripes, there occurs a problem that the stripes themselves are visible on the screen. This problem is now being solved by improving a non-single-crystal semiconductor film as a subject of laser irradiation and decreasing the pitch of a scan with linear laser beams (i.e., the interval between adjacent linear laser beams). An experiment of the inventors showed that a proper scanning pitch was about ⅒ of the width of a linear laser beam.

As the above-described striped pattern became less remarkable, the non-uniformity in the energy profile of a beam itself came to be more recognizable. In general, a linear laser beam is formed by passing an original rectangular beam through a proper lens group. The original rectangular beam having an aspect ratio of about 2 to 5 is deformed into a linear beam having an aspect ratio of 100 or more by, for instance, a lens group (called a beam homogenizer) shown in FIG. 2. This lens group is designed so as to uniformize also the intrabeam energy profile. The energy profile is uniformized by dividing the original rectangular beam, enlarging the respective divided beams, and then combining the divided beams together.

A simple consideration may lead to a conclusion that a beam obtained in the above manner by division and reconstruction would be higher in the degree of uniformity of the energy profile as the division is made finer. However, actually in spite of fine division made on a rectangular beam, a striped pattern as shown in FIG. 1B appeared on a semiconductor film that was irradiated with such a beam. That is, innumerable stripes were formed perpendicularly to the longitudinal direction (that is, a width direction) of a linear laser beam. The formation of such a striped pattern should result from the lens group or the fact the original rectangular beam has a striped energy profile.

To investigate which of the two reasons caused the formation of a striped pattern, the inventors conducted a simple experiment. In the experiment, how vertical stripes vary was checked when an original rectangular leaser beam was rotated before entering the lens group. Vertical stripes did not vary at all. This made it clear that rather than the original rectangular beam the lens group is relates to the formation of a striped pattern. Since this lens group uniformize the energy profile of a single-wavelength beam that is equalized in phase (since the laser produces high-intensity light by equalizing the phase, resulting laser light is equalized in phase) by dividing and reconstructing it, an explanation is made that the stripes are interference fringes of light.

The light interference is a phenomenon that light beams having the same wavelength and phase intensity or weaken each other because of a deviation in phase when they are superimposed on each other with an optical path difference. FIG. 3 shows, in terms of light intensity I, interference fringes formed by five slits 301 that are arranged at regular intervals.

Where the five slits 301 are arranged at regular intervals, a peak of interference occurs at the center position A that corresponds to the center slit of them and interference fringes are formed with that peak as the center. If the diagram of FIG. 3 is applied to a lens system consisting of a cylindrical lens group 401 and a cylindrical lens 402 as shown in FIG. 4 (corresponding to the cylindrical lens group 203 and the cylindrical lens 205 in FIG. 4, respectively), one can see that the center point A of a linear beam in FIG. 4 corresponds to the center position A in FIG. 3 and a peak of interference appears at the center point A. The beam division number of the cylindrical lens group 401 in FIG. 4 corresponds to the number of slits 301 in FIG. 3. A cylindrical lens groups is also called a multi-cylindrical lens, a lenticular lens or a flyeye lens.

In each of FIGS. 3 and 4, as the position goes from the center point A to points B or C, the intensity of interference varies periodically. Actual interference fringes of a laser beam do not exhibit such a clear intensity variation. It is presumed that this is due to energy diffusion in a semiconductor film that is caused by heat conduction.

Incidentally, in FIG. 2, the combination of the cylindrical lens group 202 and the cylindrical lens 204 acts on a laser beam in the same manner as the combination of the cylindrical lens group 203 and the cylindrical lens 205. Therefore, it is understood that the same light interference occurs also in the width direction of a linear laser beam.

It is concluded from the above discussion that in FIG. 6 a linear laser beam 601 formed by the optical system as shown in FIG. 2 has a distribution of interference peaks 602 (indicated by circles) that are arranged in matrix form in the beam 601. This conclusion is easily derived by extending the light interference of FIG. 3 to a two-dimensional case. The intervals between interference peaks are not constant because the linear beam is composed of spherical waves (when a spherical wave is cut by a straight line, the intervals between points of the same phase are not constant).

The intervals between interference peaks can be made constant by composing a linear beam from plane waves (when a plane wave is cut by a straight line obliquely, the intervals between points of the same phase are constant). FIG. 5 shows an optical system for forming such a light wave.

The optical system of FIG. 5 is different from that of FIG. 4 in that laser beams divided by a beam-incidence-side cylindrical lens group 501 are converted into parallel beams by a downstream cylindrical lens 502. This type of optical system can easily be obtained by properly setting the distance between the upstream cylindrical lens group 401 and the downstream cylindrical lens 402 in FIG. 4.

In this manner, every beam divided by the cylindrical lens group 501 is modified into a plane wave by the cylindrical lens 502. Vertical stripes were given constant intervals by using beams that were formed by the optical system of FIG. 5.

As described above, a linear beam has a distribution of interference peaks that are arranged in matrix form. Therefore, if a scan is performed along the matrix while linear laser beams are overlapped with each other (the scanning direction is perpendicular to the longitudinal direction of the linear laser beams, that is the scanning direction is equal to the width direction of the linear beam), the same location of an irradiation object is repeatedly irradiated with beam portions that are high or low in intensity of interference. As a result, stripes due to strong or weak light are formed in the beam scanning direction.

The above-mentioned striped pattern is formed in such a manner that peaks of light interference that are distributed in the direction perpendicular to the longitudinal direction of a linear laser beam are emphasized by being superimposed on each other at a pitch that is sufficiently smaller than the beam width. FIG. 7 shows how stripes are formed in the direction perpendicular to the longitudinal direction of a linear laser beam. A linear laser beam 701 has a periodical energy variation in the longitudinal direction that is caused by light interference. (Although as described above the linear laser beam 701 has a periodical energy variation also in the width direction that is caused by light interference, this component does not influence the invention much.) Stripes emphasized if the linear laser beams 701 are overlapped with each other as shown in FIG. 7.

It was very effective to overlap linear laser beams with each other obliquely as shown in FIG. 8 so that a striped pattern is not emphasized.

This is because with this manner of irradiation peak portions of interference do not strike the same location many times and are distributed uniformly over the entire substrate. However, the processing method of FIG. 8 cannot utilize the full length of leaser beams.

SUMMARY OF THE INVENTION

An object of the present invention is to eliminate unevenness of irradiation in irradiating and scanning an object with linear laser beams.

The invention provides a beam homogenizer comprising a cylindrical lens group assuming a shape of a parallelogram; and a cylindrical lens.

The parallelogram is not a rectangle.

A beam homogenizer in which one of the interior angles of the parallelogram is in a range of 30° to 89° is suitable for shaping of a linear laser beam.

A beam homogenizer in which one of the interior angles of the parallelogram is in a range of 45° to 87° is more suitable for shaping of a linear laser beam.

The invention also provides a beam homogenizer comprising a cylindrical lens group that assumes a shape of a parallelogram, the cylindrical lens group being formed by obliquely translating a lens shape that is formed by a parabola and a straight line (or a lens shape capable of focusing parallel rays having a particular wavelength in a two-dimensional space at one point); and a cylindrical lens.

The invention also provides a beam homogenizer comprising a cylindrical lens group that assumes a shape of a parallelogram, the cylindrical lens group being formed by obliquely translating a lens shape that is formed by a parabola and a straight line (or a lens shape capable of focusing parallel rays having a particular wavelength in a two-dimensional space at one point), the lens shape being perpendicular to the parallelogram; and a cylindrical lens.

In the above beam homogenizer, the parallelogram is not a rectangle.

A beam homogenizer in which one of the interior angles of the parallelogram is in a range of 30° to 89° is suitable for shaping of a linear laser beam.

A beam homogenizer in which one of the interior angles of the parallelogram is in a range of 45° to 87° is more suitable for shaping of a linear laser beam.

The invention further provides a laser irradiation apparatus comprising a cylindrical lens group that is formed by combining a plurality of cylindrical lenses each formed by translating a predetermined sectional shape to a predetermined direction, wherein the cylindrical lens group is inserted in an optical path of laser light; the sectional shape can focus parallel rays having a particular wavelength in a two-dimensional space at one point; and a line that is a collection of focal points of each of the cylindrical lenses is contained in a plane that is perpendicular to the optical path of the laser light, and is not perpendicular to a plane that contains the sectional shape.

In the above laser irradiation apparatus, the sectional shape capable of focusing parallel rays having a particular wavelength in a two-dimensional space at one point is defined as a three dimensional shape because the actual space is three dimensional.

The invention also provides a laser irradiation apparatus comprising a cylindrical lens group that is formed by combining a plurality of cylindrical lenses each formed by translating a predetermined sectional shape to a predetermined direction, wherein the cylindrical lens group is inserted in an optical path of laser light; the sectional shape can focus parallel rays having a particular wavelength in a two-dimensional space at one point; a line that is a collection of focal points of each of the cylindrical lenses is contained in a plane that is perpendicular to the optical path of the laser light, and is not perpendicular to a plane that contains the sectional shape; and the lines that are collections of focal points of the respective cylindrical lenses are parallel with each other.

In the above two laser irradiation apparatuses, it is preferable that the angle formed by the line that is a collection of focal points of each of the cylindrical lenses and the plane containing the sectional shape be in a range of 30° to 89°. It is even preferable that the angle be in a range of 45° to 87°.

The invention further provides a laser annealing apparatus comprising means for generating an original laser beam; a beam homogenizer comprising a cylindrical lens group assuming a shape of a parallelogram, for uniformizing an energy profile of a linear laser beam as a final form of beam shaping in the longitudinal direction thereof by dividing and enlarging the original laser beam; and a cylindrical lens; a cylindrical lens for focusing the laser beam into a linear shape; and a movable table that is movable in one direction.

The invention also provides a laser annealing apparatus comprising means for generating an original laser beam; a first beam homogenizer comprising a cylindrical lens group assuming a shape of a parallelogram, for uniformizing an energy profile of a linear laser beam as a final form of beam shaping in the longitudinal direction thereof by dividing and enlarging the original laser beam; and a cylindrical lens; a second beam homogenizer comprising a cylindrical lens group and a cylindrical lens, for focusing the laser beam into a linear shape by dividing and recombining the laser beam; and a movable table that is movable in one direction.

The invention also provides a laser annealing apparatus comprising means for generating an original laser beam; a beam homogenizer comprising a cylindrical lens group assuming a shape of a parallelogram, for uniformizing an energy profile of a linear laser beam as a final form of beam shaping in the longitudinal direction thereof by dividing and enlarging the original laser beam; and a cylindrical lens; a cylindrical lens for focusing the laser beam into a linear shape; and a movable table having a variable moving direction.

The invention also provides a laser annealing apparatus comprising means for generating an original laser beam; a first beam homogenizer comprising a cylindrical lens group assuming a shape of a parallelogram, for uniformizing an energy profile of a linear laser beam as a final form of beam shaping in the longitudinal direction thereof by dividing and enlarging the original laser beam; and a cylindrical lens; a second beam homogenizer comprising a cylindrical lens group and a cylindrical lens, for focusing the laser beam into a linear shape by dividing and recombining the laser beam; and a movable table having a variable moving direction.

The invention further provides a semiconductor device laser processing method for use in a process in which a substrate on which a semiconductor film is formed is irradiated and scanned with a linear laser beam, comprising the steps of shaping a laser beam into a linear laser beam while uniformizing the energy profile of the laser beam by an optical system including the above-described beam homogenizer that assumes a shape of a parallelogram; and performing laser processing on the semiconductor film while moving the linear laser beam in a direction that is perpendicular to the longitudinal direction thereof and is contained in a plane formed by the linear laser beam.

The invention also provides a semiconductor device laser processing method for use in a process in which a substrate on which a semiconductor film is formed is irradiated and scanned with a linear laser beam, comprising the steps of shaping a laser beam into a linear laser beam while uniformizing the energy profile of the laser beam by an optical system including the above-described beam homogenizer that assumes a shape of a parallelogram; and performing laser processing on the semiconductor film while moving the linear laser beam in a direction deviated, by an angle y in a plane formed by the linear laser beam, from a direction that is perpendicular to the longitudinal direction thereof and is contained in the plane, the angle y being in a range defined by $|\tan y| \leq 0.1$.

In crystallizing or improving the crystallinity of a non-single-crystal semiconductor film by annealing it by using a linear laser beam that has been produced by dividing and reconstructing a laser beam, the invention prevents the non-single-crystal semiconductor film from reflecting periodic non-uniformity in energy in the linear laser beam due to light interference.

For example, a linear laser beam formed by the lenses shown in FIG. 2 has a periodic variation in energy in its longitudinal direction.

If a semiconductor film is irradiated and scanned with linear laser beams having such an energy profile while the linear laser beams are overlapped with each other in the direction perpendicular to their longitudinal direction, the semiconductor film reflects the energy profile of the linear laser beams in an emphasized manner.

In the invention, the parallelogram-like beam homogenizer is used to change the interference profile in a laser beam from the conventional case so that the same location of a semiconductor film is not repeatedly irradiated with maximum or minimum energy portions of beams. As a result, energy variations of linear laser beams are dispersed over the semiconductor film and hence the laser annealing effect can be uniformized.

BRIEF DESCRIPTION OF THE DRAWINGS

FIGS. 18A and 18B show laser beam scanning directions that make the light interference profiles of FIGS. 17A and 17B, respectively, least influential;

FIGS. 21A and 21B show laser beam scanning directions that make the light interference profiles of FIGS. 20A and 20B, respectively, least influential.

DETAILED DESCRIPTION OF THE PREFERRED EMBODIMENTS

Figure 1A:
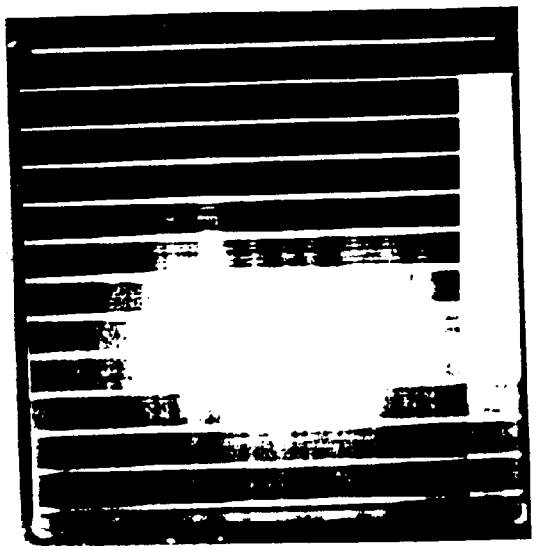
FIGS. 1A and 1B are photographs of silicon films that were crystallized by a linear laser beam.
Figure 1B:
Figure 2:
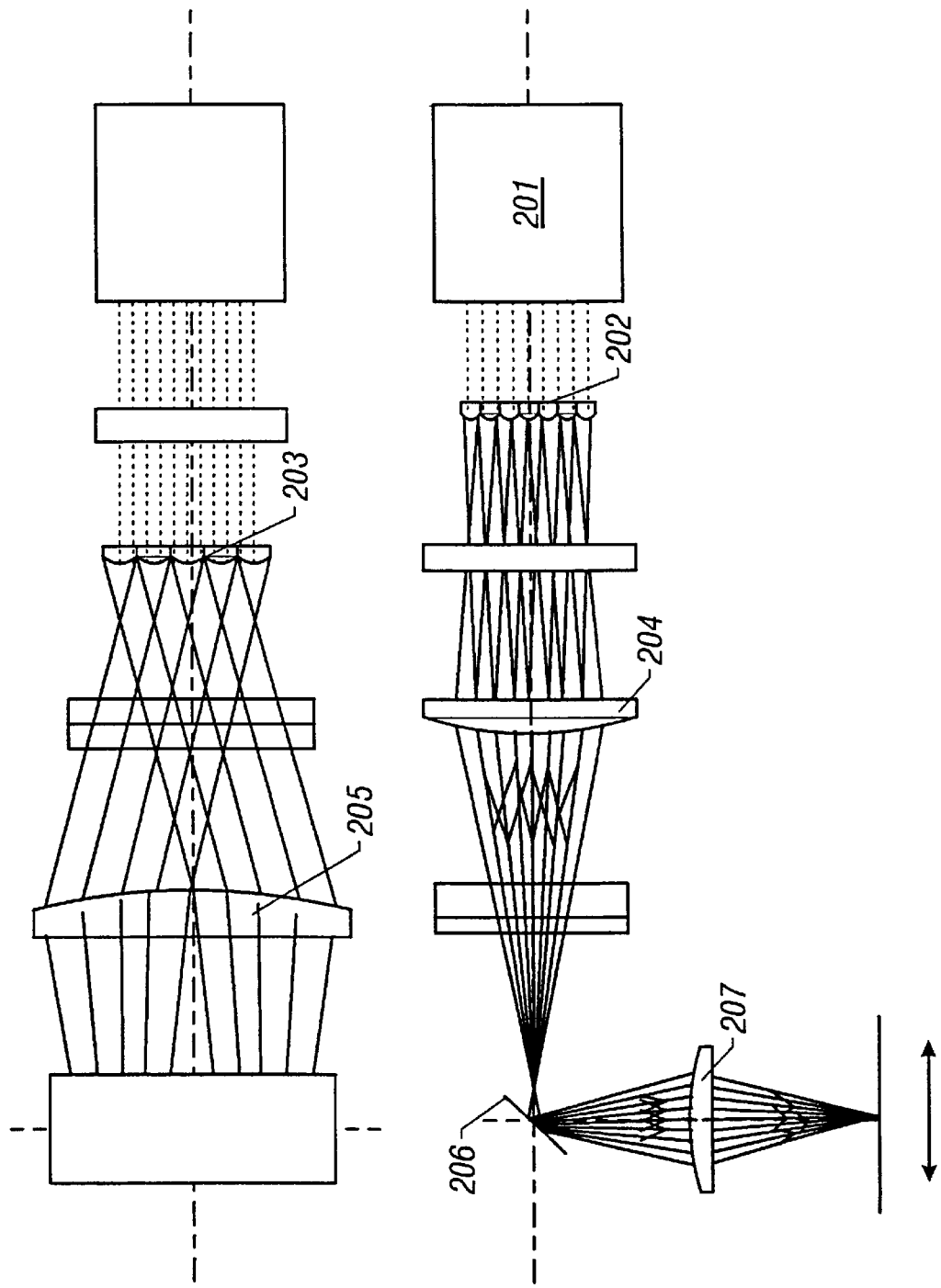
FIG. 2 shows an optical system of a type that is used in embodiments of the present invention to form a linear laser beam.
Figure 3:
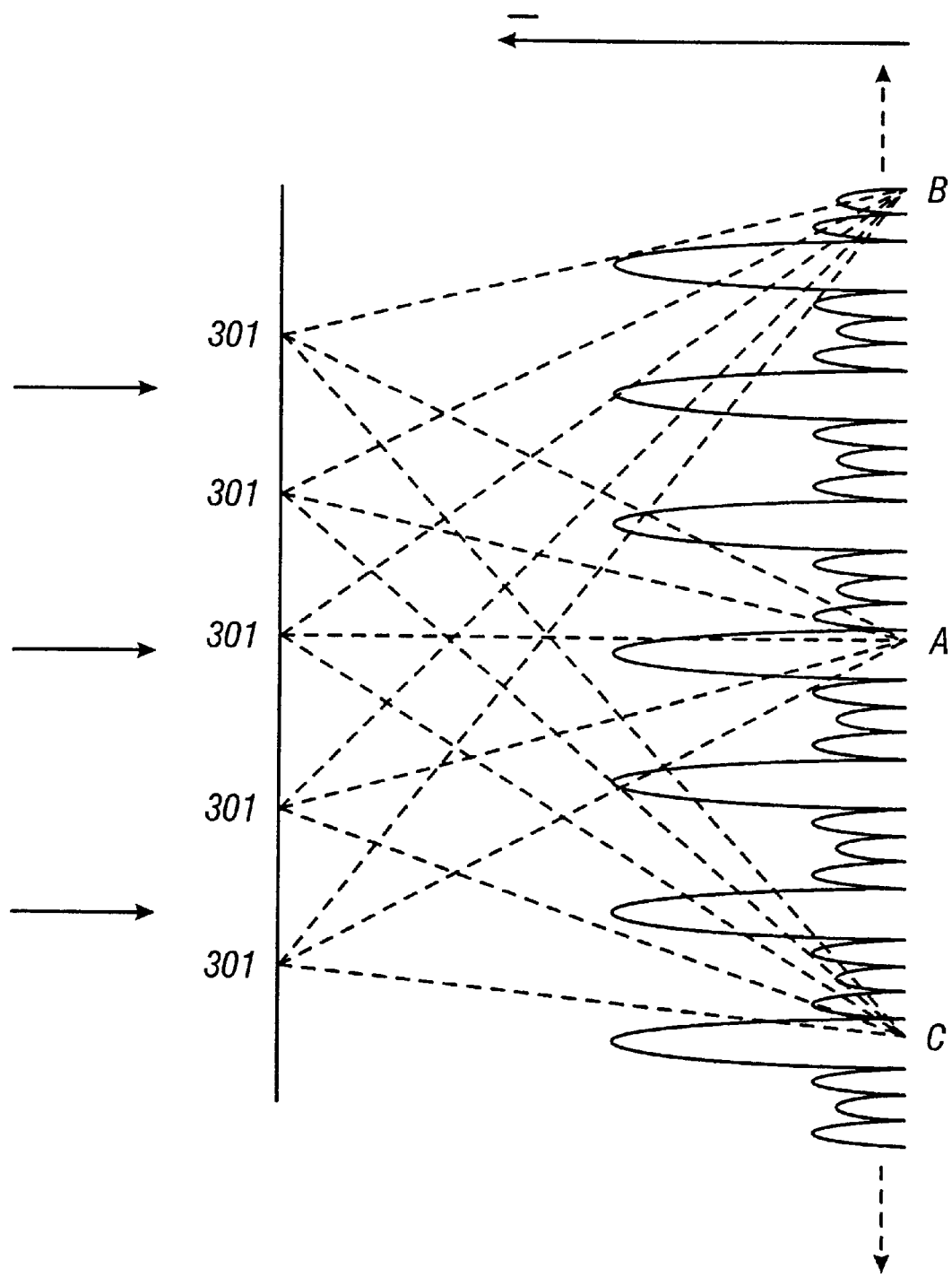
FIG. 3 illustrates how five light beams interfere with each other.
Figure 6:
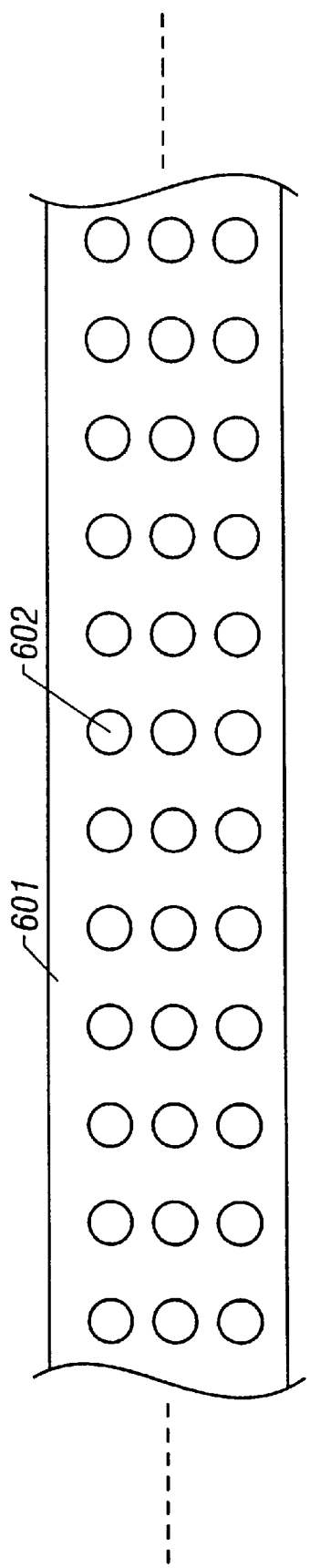
FIG. 6 shows a light interference profile in a linear light that has been shaped by an optical system including a cylindrical lens group.
Figure 7:
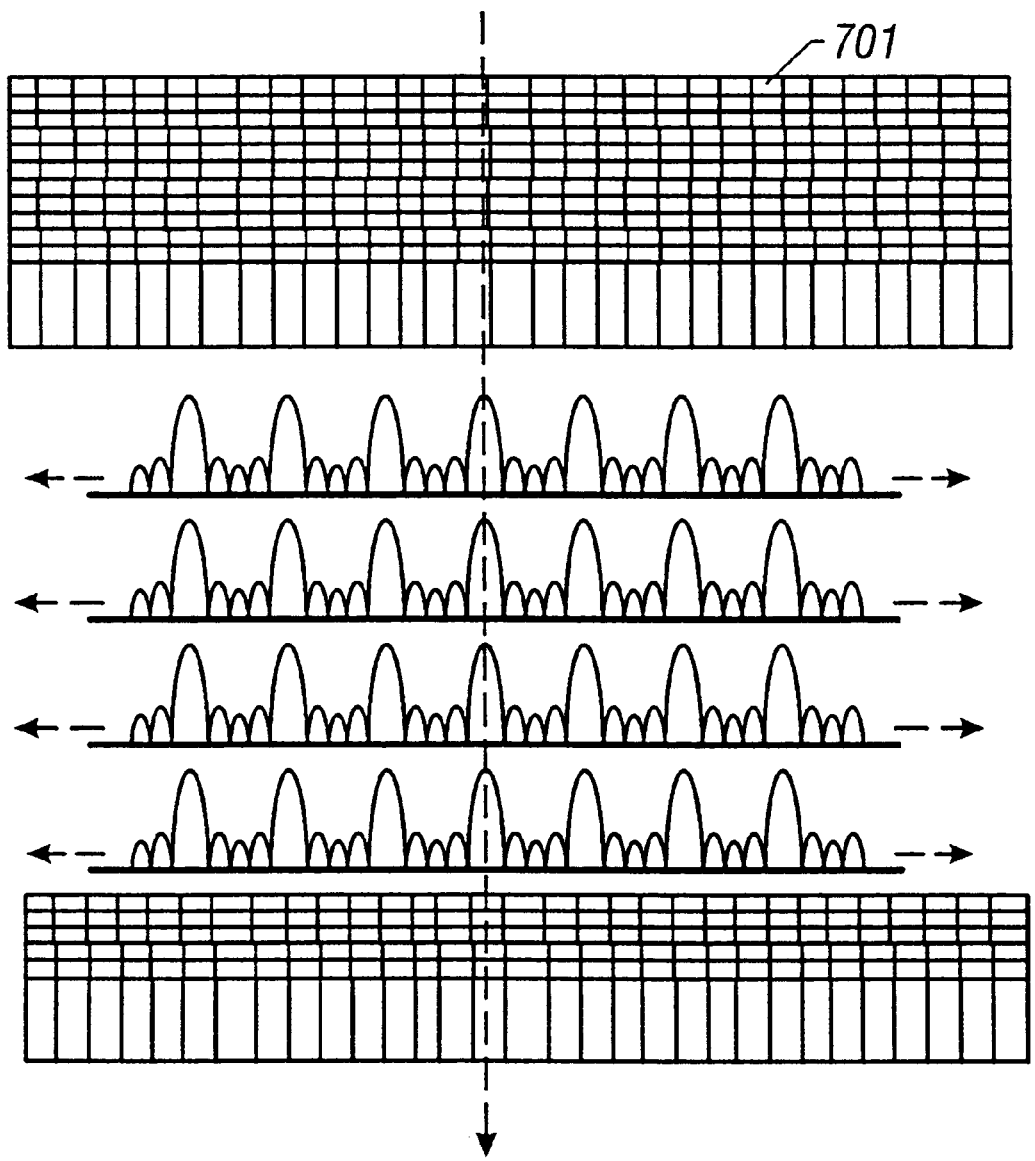
FIG. 7 shows a manner of laser irradiation in which light interference is emphasized.
Figure 11:
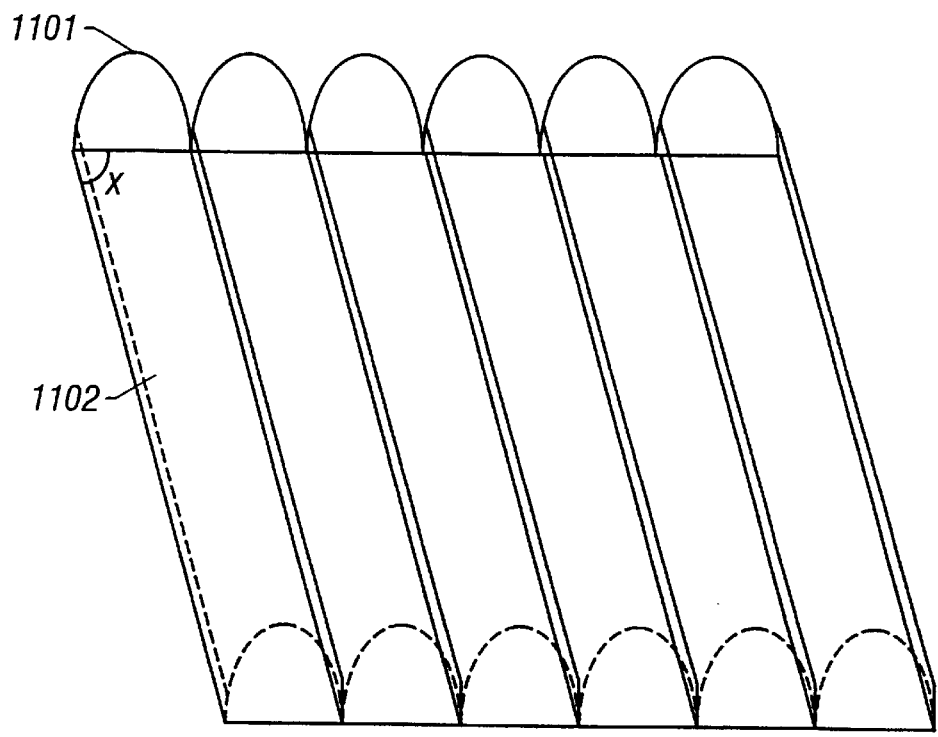
FIG. 11 shows a parallelogram-like cylindrical lens group.
Figure 12:
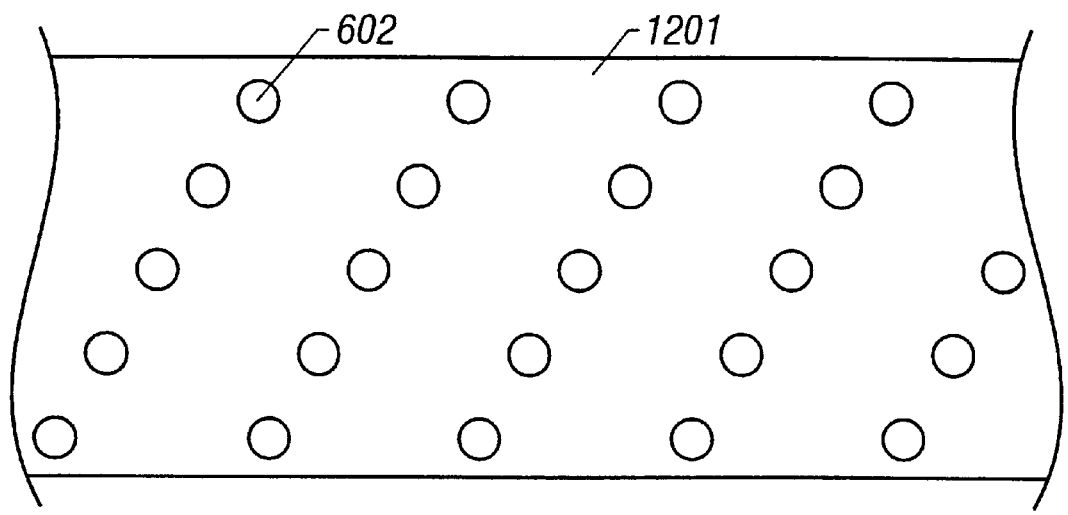
FIG. 12 shows a light interference profile in a linear laser beam that has been shaped by an optical system including the parallelogram-like cylindrical lens group of FIG. 11.

According to the invention, the shape of the cylindrical lens group 203 in FIG. 2 is changed into a parallelogram-like shape shown in FIG. 11, whereby the distribution of interference peaks formed in linear laser beams (see FIG. 6) is changed to one shown in FIG. 12. Each constituent lens of the lens group shown in FIG. 11 is formed in such a manner that a lens shape 1101 formed by a parabola and a straight line (i.e., a sectional shape of a lens that can focus parallel light having a particular wavelength in the two-dimensional space at one point) is elongated obliquely.

Figure 13:
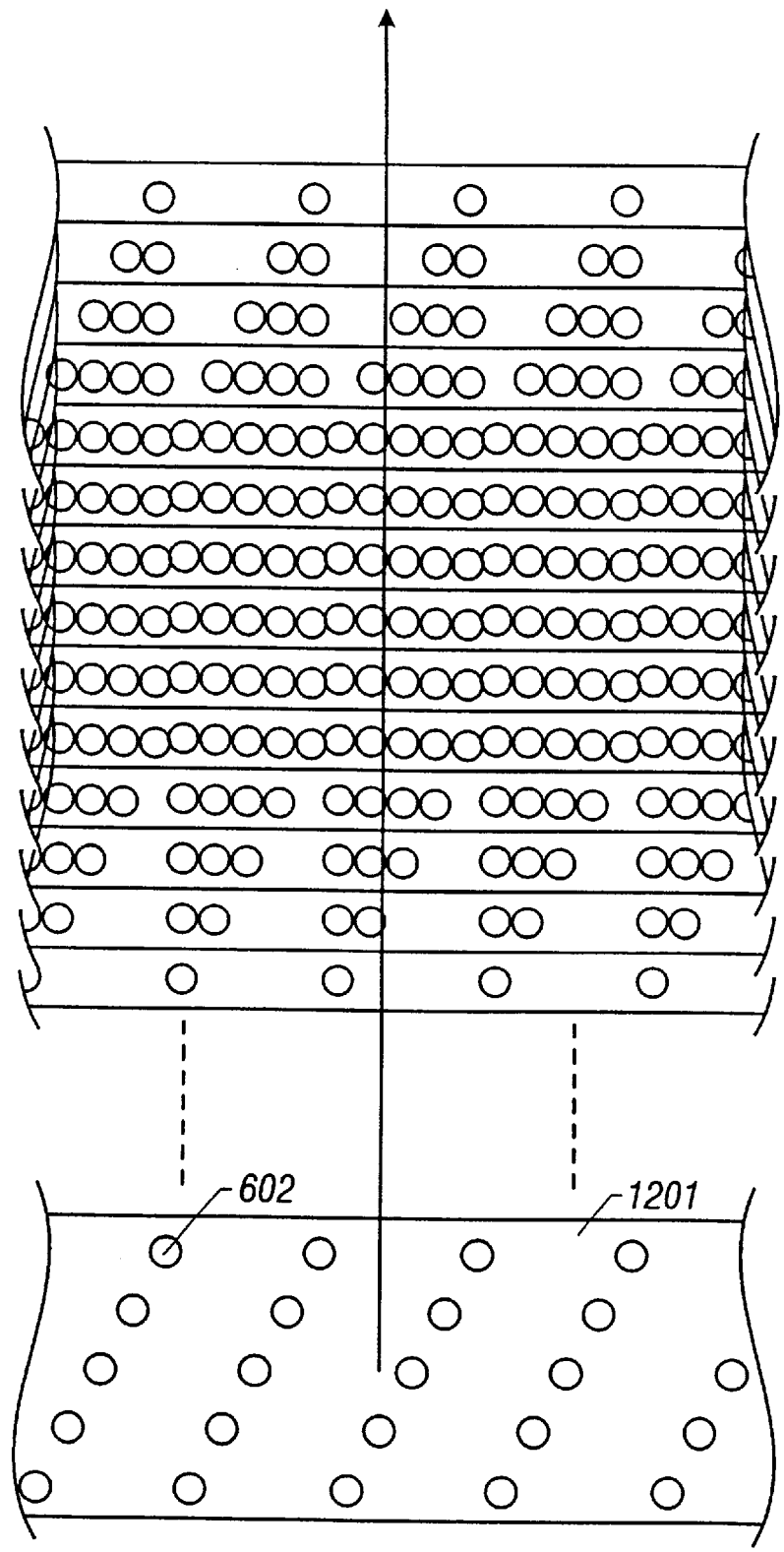
FIG. 13 shows a manner of laser irradiation in which light interference is made less remarkable.
Figure 14:
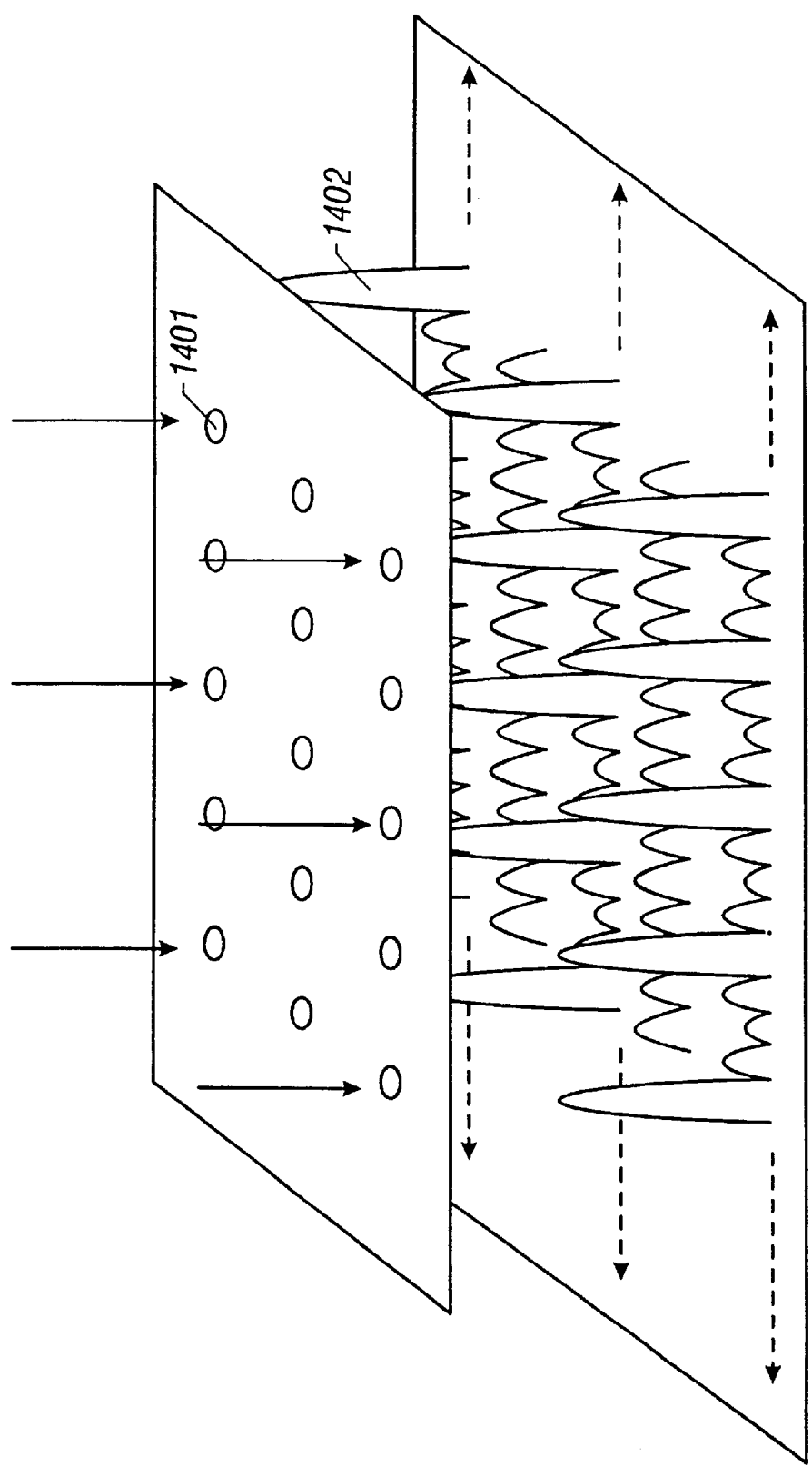
FIG. 14 shows a light interference profile formed by pinholes that are arranged in matrix form and have parallelogram units.

The figure 1101 and a parallelogram 1102 are perpendicular to each other. If linear laser beams 1201 having an energy profile as shown in FIG. 12 are overlapped with each other in the direction perpendicular to the longitudinal direction of the beams 1201 (in which direction the maximum processing efficiency is obtained), interference peaks are not superimposed on each other many times because the beams 1201 are overlapped with each other as shown in FIG. 13. As a result, peaks of light interference in linear laser beams are not emphasized on a semiconductor film and a striped pattern almost disappears. This method is advantageous over the method of FIG. 8 in that the processing efficiency with linear laser beams can be maximized.

The fact that the light interference profile as shown in FIG. 12 is obtained by using an optical system including the lens group as shown in FIG. 11 is easily understood by applying, to the case of laser beams, a light interference profile 1402 formed by pinholes 1401 that are arranged in matrix form and have parallelogram units.

Figure 15:
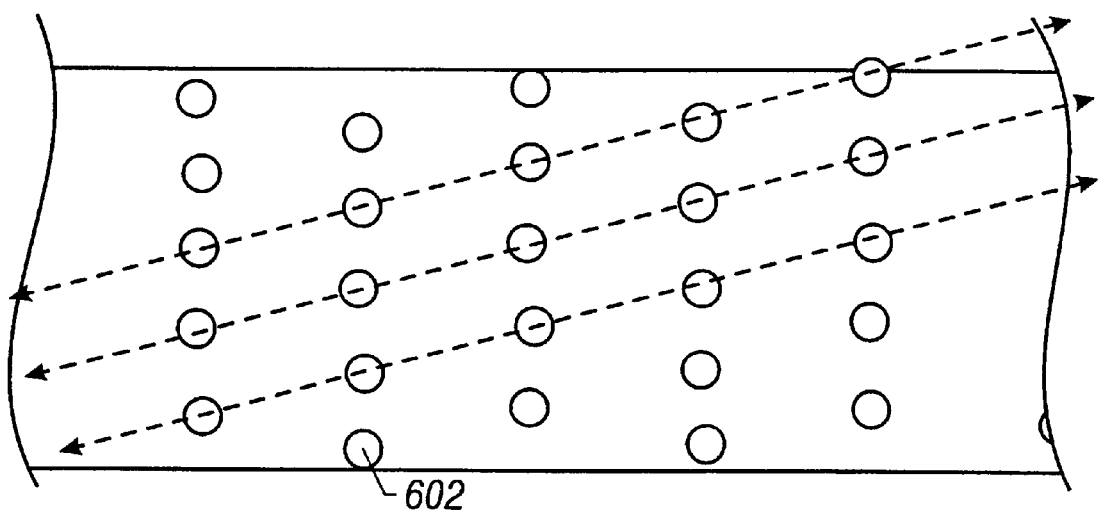
FIG. 15 shows a light interference profile in a linear laser beam that has been shaped by an optical system including the parallelogram-like cylindrical lens group of FIG. 11.

Based on the above-described model, laser beams of various light interference profiles can be produced. For example, if the cylindrical lens group 202 in FIG. 2 is replaced by the lens group shown in FIG. 11, a light interference profile as shown in FIG. 15 is obtained. However, this type of light interference profile is not effective when employed in the invention, because light interference peaks are arranged in the direction perpendicular to the longitudinal direction of linear laser beams.

A linear laser beam can also be formed by making a parallelogram-like lens in such a manner that the figure 1101 and the parallelogram 1102 are not perpendicular to each other. In this case, the regularity of the distribution of interference peaks is not very suitable for the invention. However, the number of stripes formed is much smaller than in the case of using the conventional lens group.

The interior angles of the parallelogram that is the side face of the parallelogram-like cylindrical lens group shown in FIG. 11 are determined by the beam width and the interval between interference peaks that are distributed in the longitudinal direction of a linear laser beam. Satisfactory results were obtained when the acute one of the angles was 30°–89°, preferably 45°–87°.

This angular range is set so that beam portions corresponding to interference peaks are applied only once or are not applied even once. Points that are irradiated with a beam portion corresponding to an interference peak should be distributed as uniformly as possible in the substrate surface.

Figure 5:
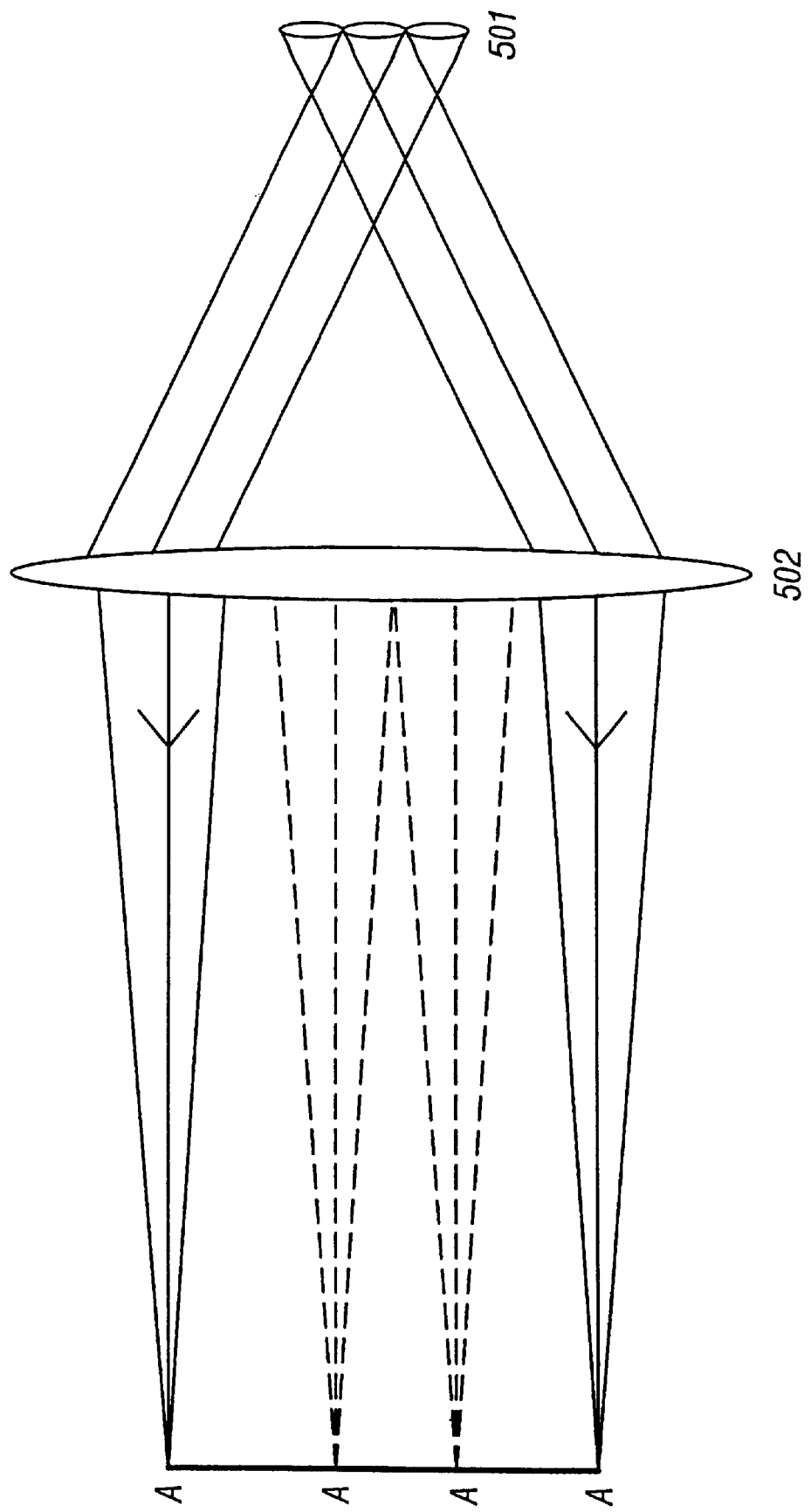
FIG. 5 shows optical paths of an optical system for forming a linear laser beam through beam division and recombination.

Since the lens arrangement shown in FIG. 5 for producing plane waves can be applied to an optical system including the lens group of FIG. 11, the employment of a lens arrangement according to FIG. 5 contributes to improvement in uniformity. This is because the intervals between interference peaks become constant.

Specifically, where the intervals between interference peaks are about 0.5 mm and are distributed uniformly and the beam width is 0.4 mm, the above-mentioned angle may be determined to be an angle X that is defined by tan X=0.8. Where a rectangular beam having a larger beam width than in the above case is formed by the same means as in forming the above-mentioned linear beam and is used for laser annealing, the angle X can be made smaller because it has a larger beam width than the linear beam. Specifically, where the beam width is about 5 mm and the interval between interference peaks is about 0.5 mm, an angle X that is defined by tan X=0.1 was appropriate.

The angle X that is determined for the above reasons is one corresponding to a case where ideal beams are formed. Actually, the optimum angle somewhat varies depending on various factors such as subtle positional deviations of lenses that constitute the optical system, the accuracy of the lenses themselves, and the wavelength of laser light.

Figure 8:
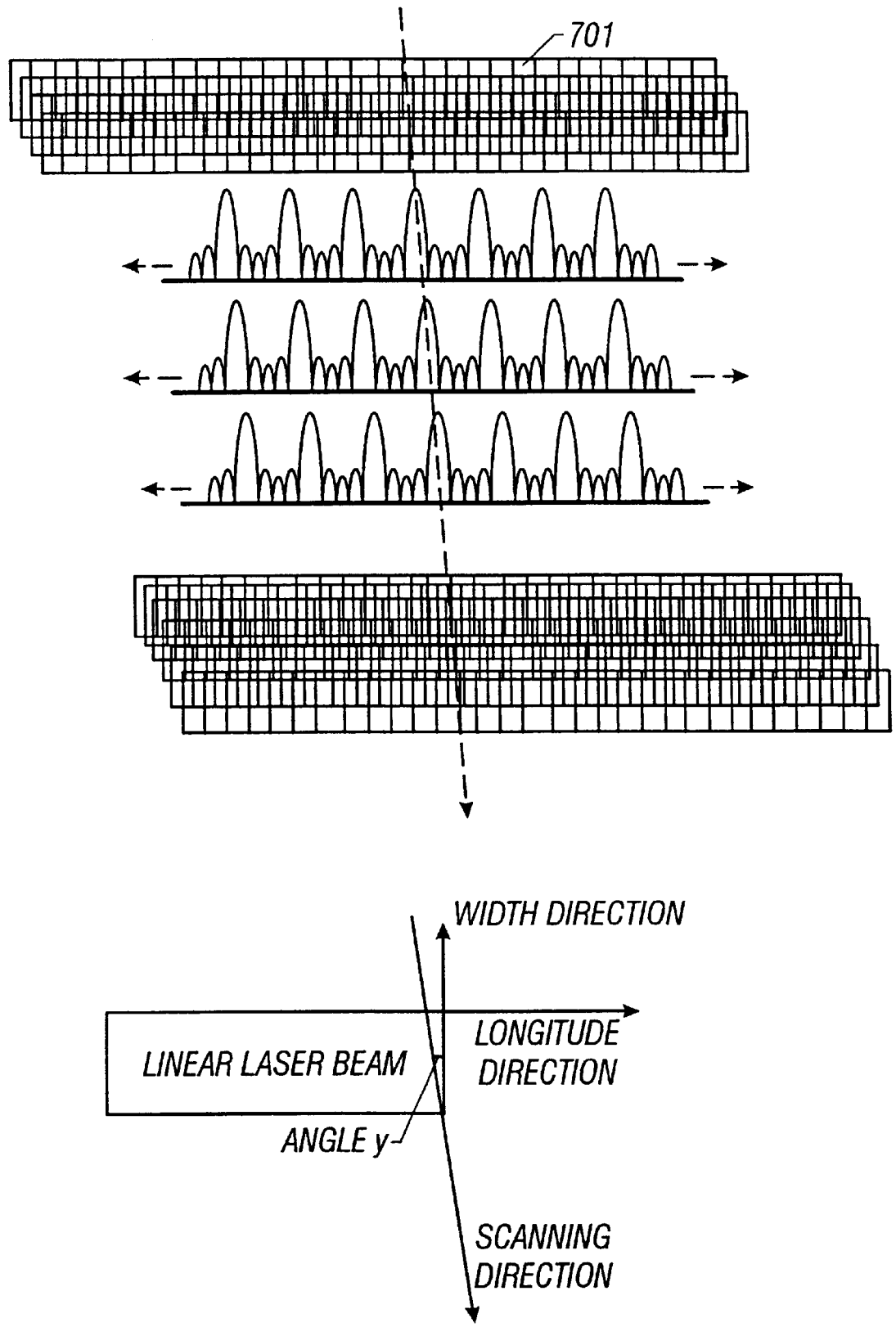
FIG. 8 shows a manner of laser irradiation in which light interference is made less remarkable.

Since the angle X cannot be adjusted, the effect of eliminating stripes is enhanced by adjusting the scanning direction as shown in FIG. 8. The change of scanning angle that is made in this case may be much smaller than the angle of FIG. 8. Specifically, an angle that enhances the effect of eliminating stripes can be found by varying an angle y that is formed by the scanning direction of a linear laser beam and its width direction in a range of |tan y|≦0.1.

The angle X that is determined for the above reasons is employed for the purpose of distributing interference peaks uniformly over the entire substrate. However, when substrates were actually irradiated, it was found that even only a slight change (about 1°) from 90° was effective. This is because making the angle X of the cylindrical lens group slightly smaller than 90° can prevent one point on the substrate from being irradiated with interference peaks many times. However, the uniformity of the laser annealing effect in the substrate surface is more improved by distributing interference peaks uniformly over the entire substrate.

In any of the above laser annealing experiments where the angle X of the cylindrical lens group was changed, the intended effect was obtained even without the cylindrical lens group 202 and the cylindrical lens 204, which means that the cylindrical lens 207 may be only one lens for focusing a beam into a linear shape. The cylindrical lens group 202 is to divide a beam in the width direction of a linear laser beam and the cylindrical lens 204 is to recombine the divided laser beams by the cylindrical lens group 202. Since the lenses 202 and 204 are to improve the uniformity of a linear laser beam in the width direction, it is natural that the intended effect can be obtained even without those lenses.

Embodiment 1

As for a manufacturing process of this embodiment, methods of manufacturing semiconductor films (the specification refers to three kinds of semiconductor films) to be subjected to laser irradiation will be described first. The invention is effective for any of those kinds of semiconductor films.

For each of the three kinds of semiconductor films, a 2,000-Å-thick silicon oxide film as a base film is formed on a 127-mm-square Corning 1737 as a glass substrate by plasma CVD and a 500-Å-thick amorphous silicon film is formed thereon also by plasma CVD continuously with the formation of the silicon oxide film. The amorphous silicon film will be hereinafter called an initial film.

(Manufacturing Procedure of Semiconductor Film A)

The initial film is heated at 450° C. for one hour. This step is to decrease the hydrogen concentration of the amorphous silicon film. The reason why this step is employed is that if the hydrogen concentration in the amorphous silicon film is too high the film cannot withstand laser beam energy.

The appropriate hydrogen concentration of the film is on the order of $10^{20}$ atoms/cm$^3$. A resulting film is called a non-single-crystal silicon film A.

(Manufacturing Procedure of Semiconductor Film B)

A nickel acetate layer is formed by applying a 10-ppm aqueous solution of nickel acetate on the initial film by spin coating. It is preferable that a surfactant be added to the nickel acetate aqueous solution. Since the nickel acetate layer is extremely thin, it is not always in film form, which however will not cause any problem in the following steps.

Then, the substrate on which the respective films have been formed in the above manner is subjected to thermal annealing of 600° C. for 4 hours. As a result, the amorphous silicon film is crystallized into a non-single-crystal silicon film, i.e., a crystalline silicon film B.

In the above step, nickel as a catalyst element serves as nuclei of crystal growth, thereby accelerating the crystallization. The fact that the crystallization can be effected at a low temperature (600° C.) in a short time (4 hours) is due to the function of nickel. For details, refer to Japanese Laid-Open Patent Application No. Hei. 6-244104.

It is preferable that the concentration of the catalyst element be $1\times10^{15}$ to $1\times10^{19}$ atoms/cm$^3$. If it is higher than $1\times10^{19}$ atoms/cm$^3$, the crystalline silicon film exhibits metallic properties and properties as a semiconductor disappear. In this embodiment, the concentration of the catalyst element in the crystalline silicon film is $1\times10^{17}$ to $5\times10^{18}$ atoms/cm$^3$ in the film. These values are ones obtained through an analysis and a measurement by secondary ion mass spectroscopy (SIMS).

(Manufacturing Procedure of Semiconductor Film C)

A 700-Å-thick silicon oxide film is formed on the initial film by plasma CVD. Then, an opening is formed in a part of the silicon oxide film by photolithography/patterning so as to penetrate through the silicon oxide film. The substrate is then irradiated with UV light for 5 minutes in an oxygen atmosphere to have a thin oxide film formed in the opening portion. The thin oxide film is formed to improve the wettability of the opening portion to a nickel acetate aqueous solution that will be introduced later.

Then, a 100-ppm aqueous solution of nickel acetate is applied to the film by spin coating, whereby nickel acetate goes into the opening portion. It is preferable that a surfactant be added to the nickel acetate aqueous solution.

Subsequently, thermal annealing is performed at 600° C. for 8 hours, whereby crystal growth proceeds laterally starting from the portion where nickel has been introduced. In this step, nickel acts as a catalyst as well as in manufacturing the film B. Under the conditions of this embodiment, the lateral growth length was about 40 μm. The amorphous silicon film is crystallized in this manner into a non-single-crystal silicon film, i.e., a crystalline silicon film C. Thereafter, the silicon oxide film on the crystalline silicon film is removed by using buffered hydrofluoric acid.

To crystallize or improve the crystallinity of each of the non-single-crystal silicon films A, B, and C, laser annealing is performed by using an excimer laser.

Figure 9:
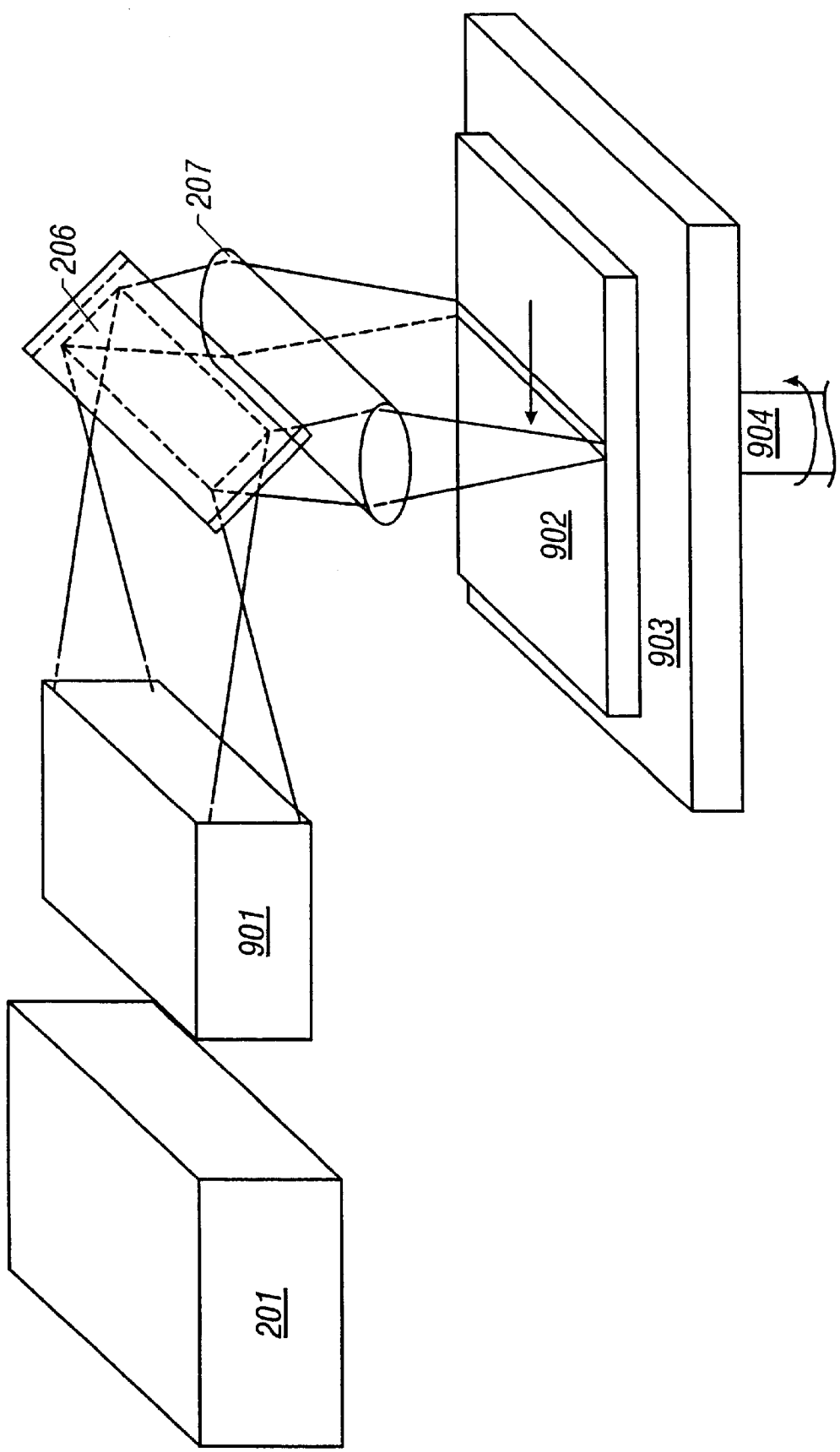
FIG. 9 shows a laser irradiation system according to a first embodiment of the invention.

FIG. 9 schematically shows a laser irradiation system according to this embodiment.

In the laser irradiation system of FIG. 9, a pulse laser beam emitted from a laser oscillation device 201 is shaped by an optical system 901 into a beam having a linear sectional profile, which is then reflected by a mirror 206, focused by a cylindrical lens 207, and applied to a substrate 902 to be processed. The optical system 901, the mirror 206, and the cylindrical lens 207 are also shown in FIG. 2. However, in the laser irradiation system of FIG. 9, the cylindrical lens group 203 among the lenses shown in FIG. 2 is replaced by a parallelogram-like cylindrical lens group 1101. One of the interior angles of the parallelogram of the parallelogram-like cylindrical lens group 1101 is set at 80°.

The reason why the optical system of the type shown in FIG. 2, though the cylindrical lens group 203 is replaced with 1101 mentioned above, is used is that it can modify the beam shape into a linear shape while averaging the non-uniformity in beam energy before the entrance to the optical system by dividing and recombining the beam. All of linear laser beams that are used in the invention are obtained through the modification into a linear beam by the optical system of the type shown in FIG. 2. Although the modification into a linear beam may be made by an optical system of a type different from the type of FIG. 2, even in such a case the energy profile of a resulting linear beam should be similar to that obtained by an optical system of the type shown in FIG. 2. The roles of the lenses of the type shown in FIG. 2 will be described below.

The cylindrical lens groups 202 and 1101 have a role of dividing a beam in the horizontal and vertical directions. The cylindrical lenses 204 and 205 have a role of collecting the divided light beams into one region, which is a linear region in this embodiment. In this embodiment, the energy profile of a beam is averaged by dividing an original beam into 7 parts in each of the horizontal and vertical directions, i.e., into 49 parts in total and then combining the divided beams into a single beam. Although the ratio between the horizontal and vertical lengths of a beam is variable because of the configuration of the lens system, easy-to-form beam shapes are restricted by the size of the lenses and the combination of focal lengths. In the optical system under consideration, the longer-side length of a beam cannot be changed.

Figure 4:
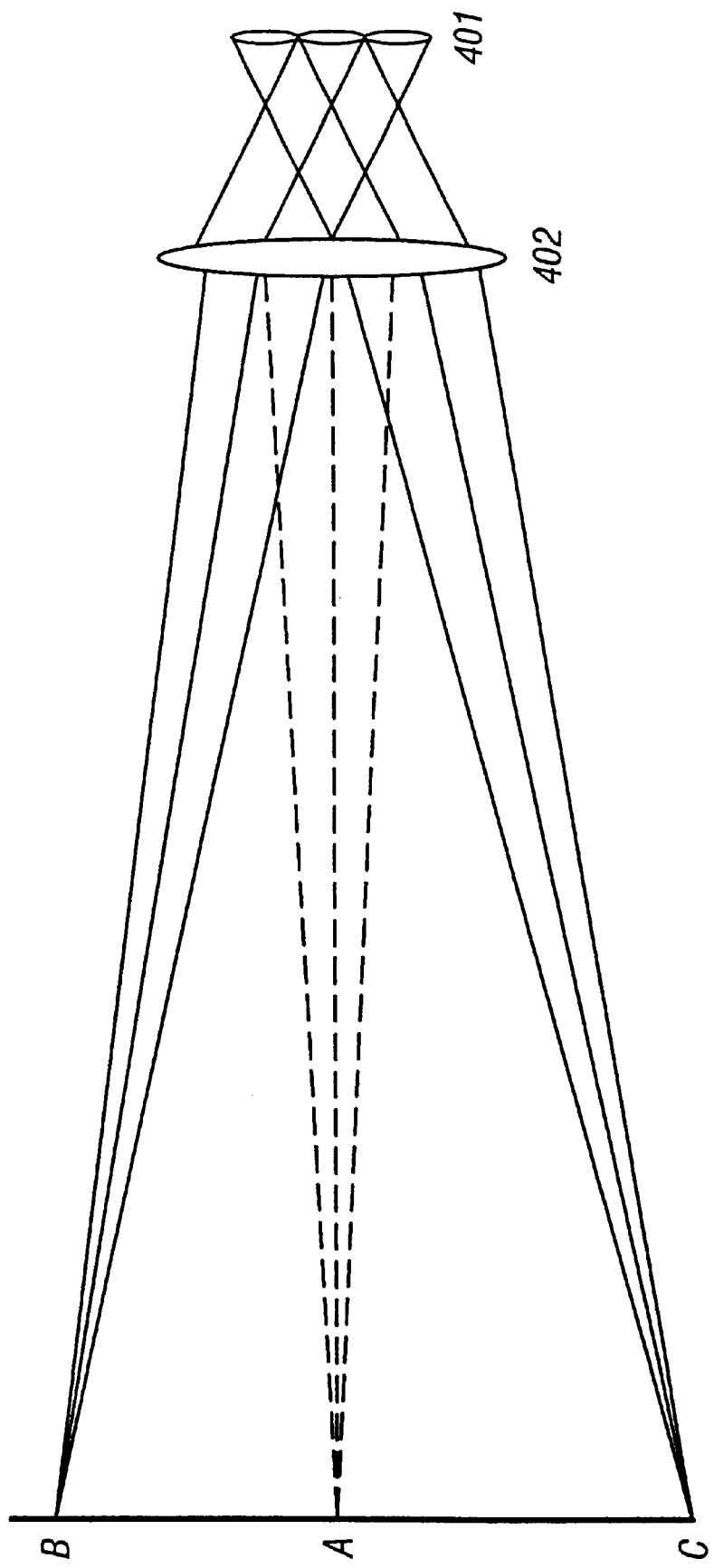
FIG. 4 shows optical paths of an optical system for forming a linear laser beam through beam division and recombination.

In this embodiment, the intended effect was obtained with the lenses shown in each of FIG. 4 and FIG. 5. Although each of the cylindrical lens groups 202 and 1101 is a convex lens group, the use of a convex lens group is not essential to the invention; a concave lens group or a convex/concave-mixed lens group may also be used. Further, the constituent lenses of the cylindrical lens groups 202 and 1101 may have different sizes in either case of using convex lens groups or concave lens groups.

Figure 22:
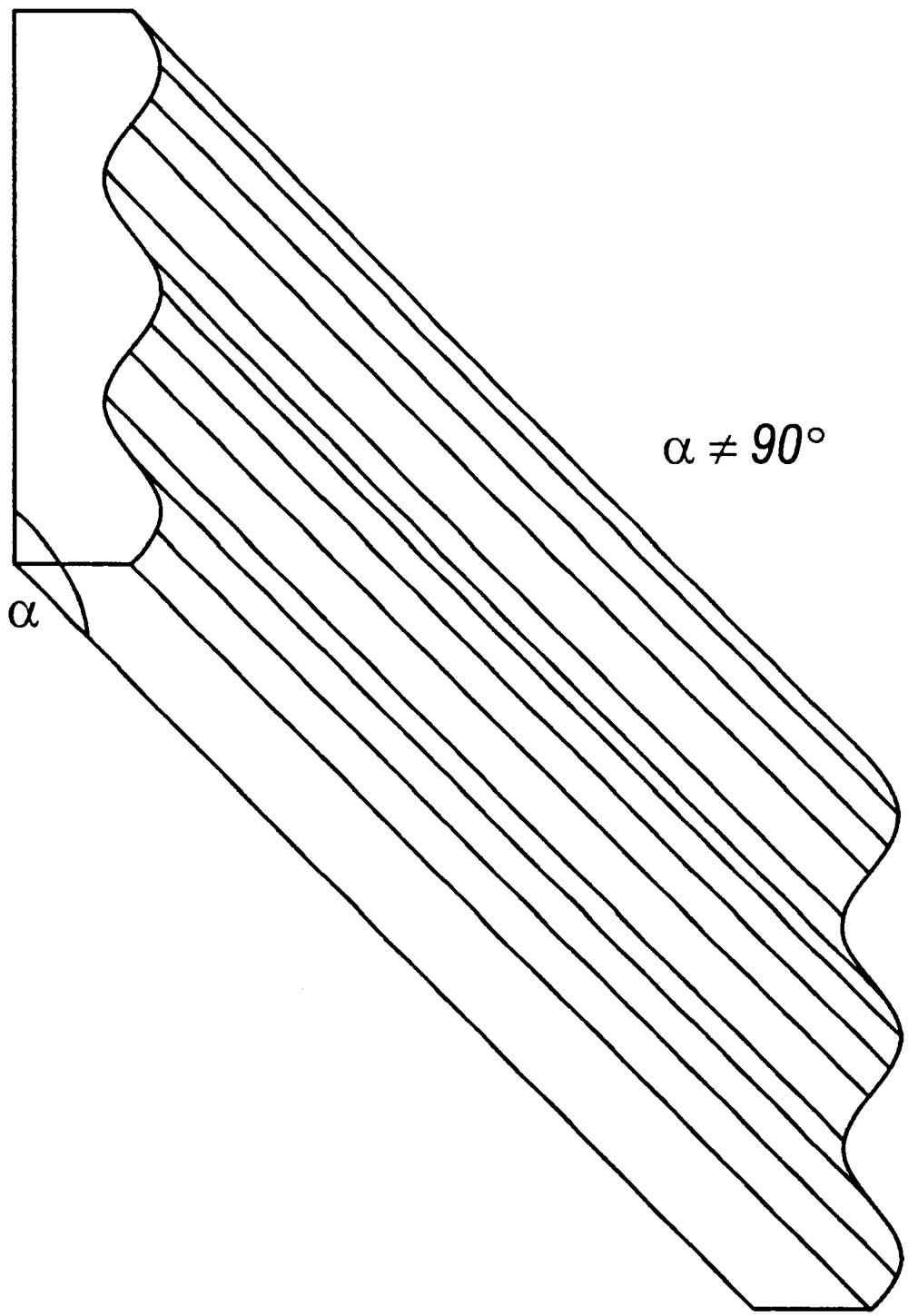
FIG. 22 shows the shape of a cylindrical lens group.

FIG. 22 shows an example of a convex/concave-mixed lens group that has the same function as and hence can replace the cylindrical lens group 1101 of FIG. 11. However, in the case of using a lens group whose constituent lenses are not congruous with each other as typified by a convex/concave-mixed lens group, the lens group should consist of the respective constituent lenses which have the same divergences angle after the parallel beams are processed. Otherwise, when divided beams are recombined, they would have different sizes and shapes and hence the outline of a resulting beam would be blurred.

In this embodiment, the laser oscillation device 201 is a XeCl excimer laser (wavelength: 308 nm). Other usable lasers include a KrF excimer laser (wavelength: 248 nm).

The substrate 902 to be processed is mounted on a stage 903. The stage 903 can be moved straight, by a moving mechanism 1007, in the direction perpendicular to the longitudinal direction of a linear laser beam (and contained in the plane that contains the linear laser beam), to allow the top surface of the substrate 902 to be irradiated and scanned with laser beams.

Figure 10:
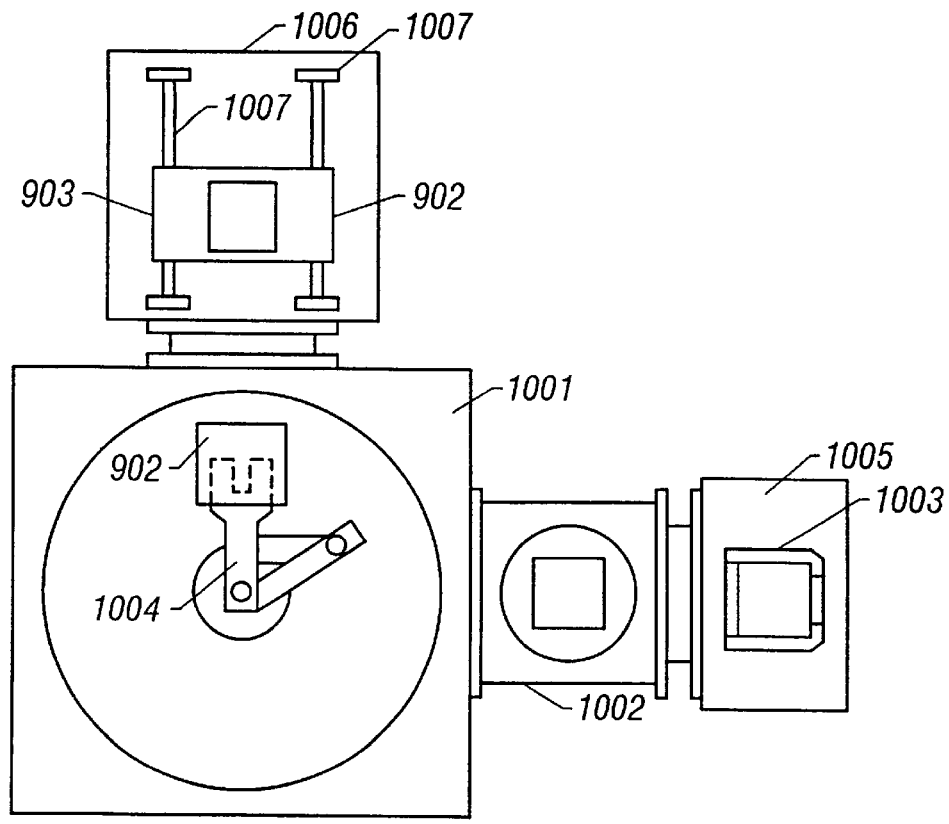
FIG. 10 shows a laser annealing apparatus according to the first and third embodiments.

A laser annealing apparatus shown in FIG. 10 will be described below. A cassette 1003 accommodating a number of, for instance, 20, substrates 902 to be processed is placed in a load/unload chamber 1005. One substrate 902 is moved from the cassette 1003 to an alignment chamber 1002 by a robot arm 1004.

The alignment chamber 1002 is provided with an alignment mechanism for adjusting the positional relationship between the substrate 902 to be processed and the robot arm 1004. The alignment chamber 1002 is connected to the load/unload chamber 1005.

The substrate 902 is transported, by the robot arm 1004, to a substrate transport chamber 1001 and then to a laser irradiation chamber 1006. Referring to FIG. 9, it is assumed that a linear laser beam having a width 0.4 mm and a length 135 mm is applied to the substrate 902 to be processed. The beam is formed by the lenses having the arrangement of FIG. 5 to be a plane wave.

The laser beam energy density on the irradiation surface is set at 100–500 mJ/cm$^2$, for instance, 300 mJ/cm$^2$. The substrate 902 is irradiated and scanned with linear laser beams by moving the stage 903 in one direction at 1.2 mm/s. The laser oscillation frequency is set at 30 Hz. With these settings, one point on the substrate 902 is irradiated with 10 shots of laser beams. The number of shots is set at a proper number in a range of 5–50.

After completion of the laser irradiation, the substrate 902 is returned to the substrate transport chamber 1001 by the robot arm 1004. Then, the substrate 902 is transported to the load/unload chamber 1005 and put into the cassette 1003 by the robot arm 1004.

The laser annealing process is thus completed. By repeating the above process, a number of substrates 902 can be processed successively one by one.

Although this embodiment uses a linear laser beam, it was confirmed that the advantages of the invention can be obtained with various beam shapes ranging from a linear shape to a square.

Embodiment 2

If a striped pattern is not properly eliminated by the first embodiment, the reason would be one of the following: an improper arrangement of the optical system, an improper intervals of superimposition of linear laser beams, and an improper angle X of the parallelogram-like cylindrical lens group 1101. As a matter of fact, if the optical system is designed in such a manner that interference peak positions are calculated and a angle X most suitable for such conditions is determined for each case, the parallelogram-like cylindrical lens group 1101 needs to be customized for each case. In this design method, the lens group 1101 becomes very expensive.

In this embodiment, the above problem is solved by combining the parallelogram-like cylindrical lens group 1101 of the invention and the scanning direction determining method of FIG. 8.

Figure 17A:
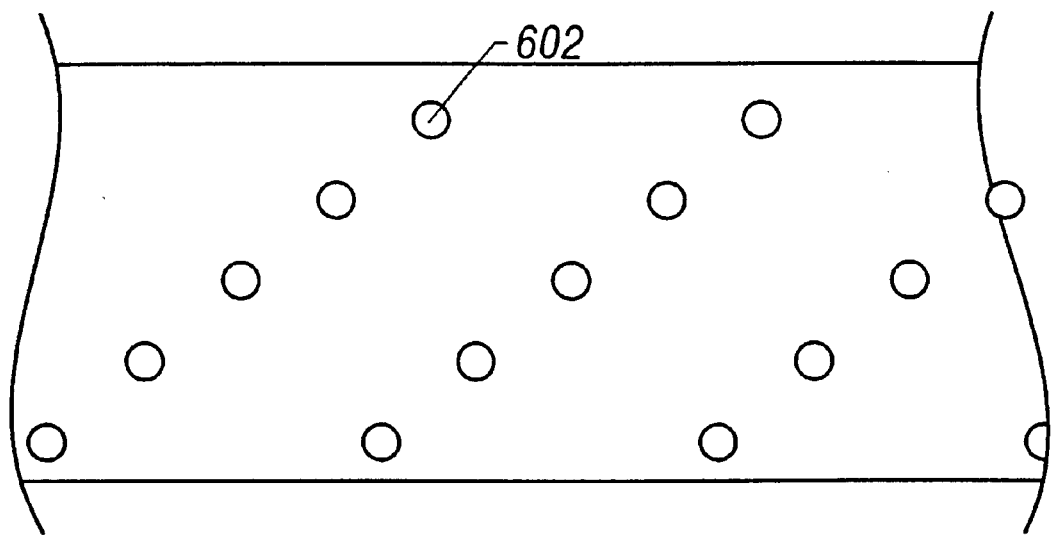
FIGS. 17A and 17B show light interference profiles in linear laser beams that are produced by an optical system including the parallelogram-like cylindrical lens group.
Figure 17B:
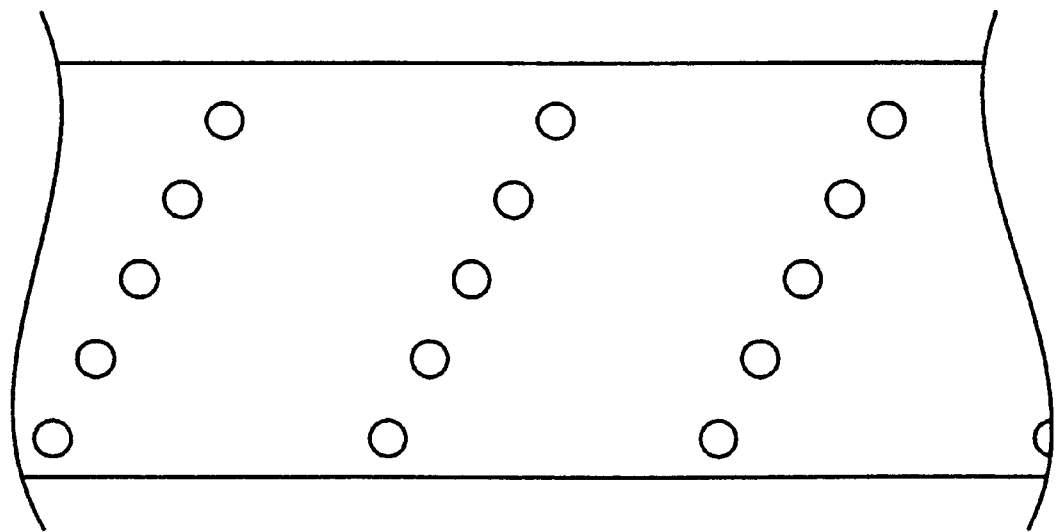

That is, where interference peak positions that are formed by the beam homogenizer including the cylindrical lens group 1101 are as shown in FIG. 17A or 17B, the substrate scanning direction is finely adjusted by a scanning direction changing device 904 in FIG. 9 so as to be one as shown in FIG. 18A or 18B. As a result, the interference peaks are distributed with a higher degree of uniformity over the substrate. In FIGS. 17A–17B and 18A–18B, the inclination is drawn in an exaggerated manner.

As mentioned above, it is more proper to vary an angle y that is formed by the scanning direction of the linear laser beam and the width direction thereof as shown in FIG. 8 in a range of $|\tan y| \leq 0.1$.

Embodiment 3

Figure 16:
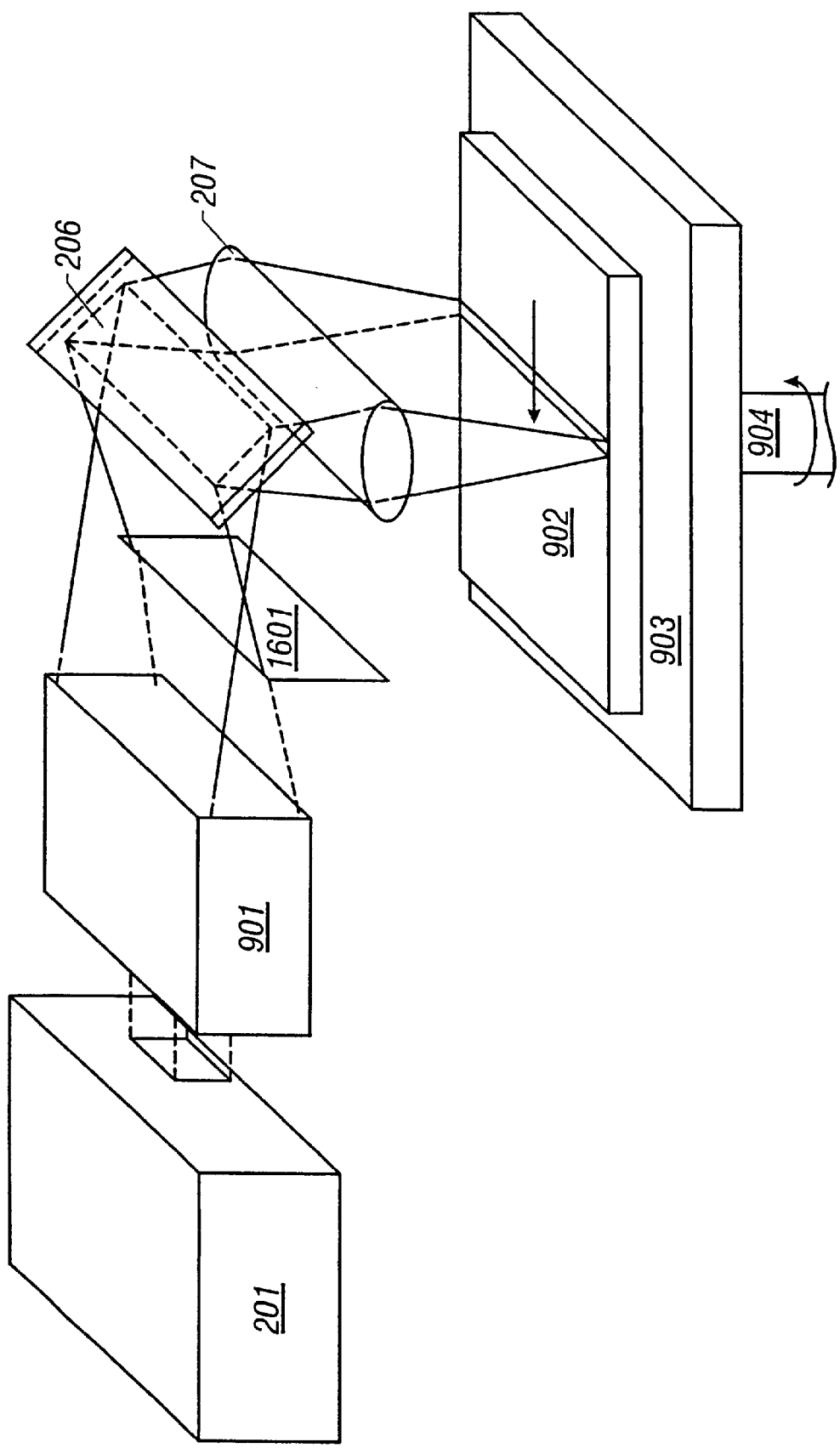
FIG. 16 shows a laser irradiation system according to a second embodiment of the invention.

In this embodiment, laser annealing is performed by using an excimer laser and an optical system shown in FIG. 16 to crystallize or improve the crystallinity of the non-single-crystal silicon films A, B, and C.

A cylindrical lens group 1101 has a role of dividing a beam in the longitude direction and a cylindrical lens 205 has a role of collecting the divided beams into a single region.

In this embodiment, the beam energy profile is averaged by dividing an original beam into 10 parts in the longitude direction. A cylindrical lens 207 has a role of focusing a laser beam into a linear shape. Although the cylindrical lens 207 can realize an ideal case in which a laser beam is focused into a perfect line, in this embodiment the focal point of the cylindrical lens 207 is slightly deviated from the irradiation surface, to form a beam having a width 0.3 mm.

Figure 19:
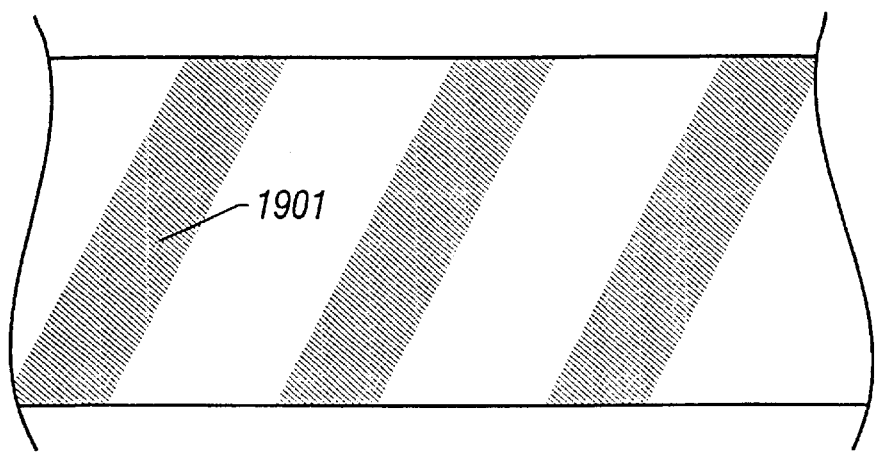
FIG. 19 shows a light interference profile in a linear laser beam that has been shaped by an optical system of the second embodiment that includes the parallelogram-like cylindrical lens group.

In this embodiment, interference fringes are formed so as to assume stripes as shown in FIG. 19 because division is not effected in the beam width direction. It goes without saying that the parallelogram-like cylindrical lens group of the invention acts effectively also for this type of interference fringes.

Laser annealing was performed with a higher degree of uniformity by enhancing the linearity of the outline that constitutes the scanning direction side of a linear beam by using a laser light shield plate 1601. It is empirically known that the linearity of the scanning direction side of a linear laser beam much more contributes to the uniformity of laser annealing than the linearity of the opposite side of the scanning direction. Therefore, it is sufficient to use only one laser light shield plate. However, if a laser beam as output from the laser oscillation device is unduly distorted, the laser beam should be shaped into a linear beam by using a slit.

In this embodiment, the intended effect was obtained with the lenses shown in each of FIG. 4 and FIG. 5. Although each of the cylindrical lens groups 202 and 1101 is a convex lens group, the use of a convex lens group is not essential to the invention; a concave lens group or a convex/concave-mixed lens group may also be used. This is described in detail in the first embodiment.

In this embodiment, the laser oscillation device 201 is a XeCl excimer laser (wavelength: 308 nm). Other usable lasers include a KrF excimer laser (wavelength: 248 nm).

The substrate 902 to be processed is mounted on a stage 903. The stage 903 can be moved straight, by a moving mechanism 1007, in the direction perpendicular to the longitudinal direction of a linear laser beam (and contained in the plane that contains the linear laser beam), to allow the top surface of the substrate 902 to be irradiated and scanned with laser beams.

A laser annealing apparatus shown in FIG. 10 will be described below. A cassette 1003 accommodating a number of, for instance, 20, substrates 902 to be processed is placed in a load/unload chamber 1005. One substrate 902 is moved from the cassette 1003 to an alignment chamber 1002 by a robot arm 1004.

The alignment chamber 1002 is provided with an alignment mechanism for adjusting the positional relationship between the substrate 902 to be processed and the robot arm 1004. The alignment chamber 1002 is connected to the load/unload chamber 1005.

The substrate 902 is transported, by the robot arm 1004, to a substrate transport chamber 1001 and then to a laser irradiation chamber 1006. Referring to FIG. 16, it is assumed that a linear laser beam having a width 0.4 mm and a length 135 mm is applied to the substrate 902 to be processed. The beam is formed by the lenses having the arrangement of FIG. 5.

The laser beam energy density on the irradiation surface is set at 100–500 mJ/cm$^2$, for instance, 300 mJ/cm$^2$. The substrate 902 is irradiated and scanned with linear laser beams by moving the stage 903 in one direction at 1.2 mn/s. The laser oscillation frequency is set at 30 Hz. With these settings, one point on the substrate 902 is irradiated with 10 shots of laser beams. The number of shots is set at a proper number in a range of 5–50.

After completion of the laser irradiation, the substrate 902 is returned to the substrate transport chamber 1001 by the robot arm 1004. Then, the substrate 902 is transported to the load/unload chamber 1005 and put into the cassette 1003 by the robot arm 1004.

The laser annealing process is thus completed. By repeating the above process, a number of substrates 902 can be processed successively one by one.

Embodiment 4

If a striped pattern is not properly eliminated by the third embodiment, the reason would be one of the following: an improper arrangement of the optical system, an improper intervals of superimposition of linear laser beams, and an improper angle X of the parallelogram-like cylindrical lens group 1101. As a matter of fact, if the optical system is designed in such a manner that interference peak positions are calculated and a angle X most suitable for such conditions is determined for each case, the parallelogram-like cylindrical lens group 1101 needs to be customized for each case. In this design method, the lens group 1101 becomes very expensive.

In this embodiment, the above problem is solved by combining the parallelogram-like cylindrical lens group 1101 of the invention and the scanning direction determining method of FIG. 8.

Figure 20A:
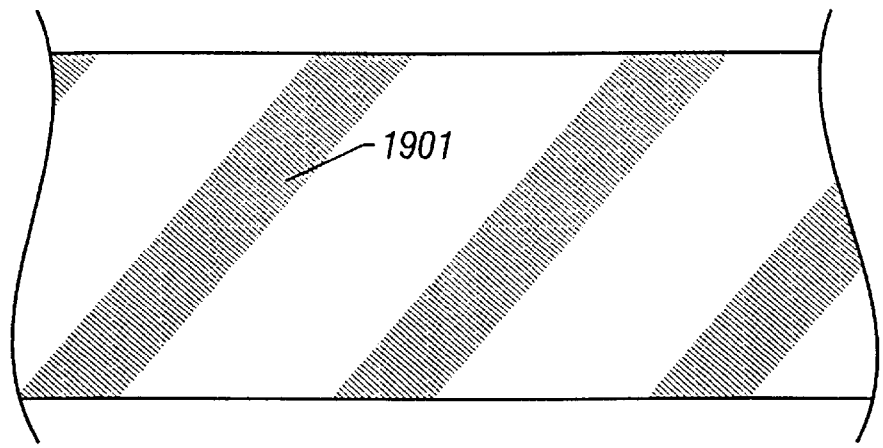
FIGS. 20A and 20B show light interference profiles in linear laser beams that are produced by an optical system including the parallelogram-like cylindrical lens group.
Figure 20B:
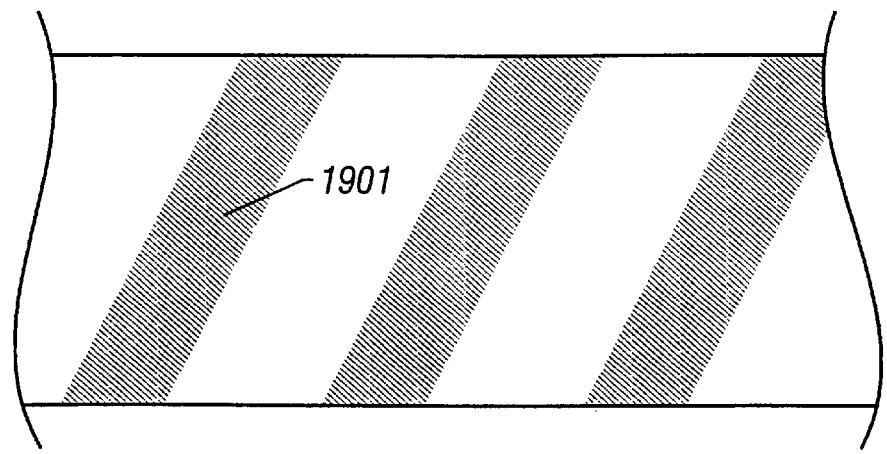

That is, where interference peak positions that are formed by the beam homogenizer including the cylindrical lens group 1101 are as shown in FIG. 20A or 20B, the substrate scanning direction is finely adjusted by a scanning direction changing device 904 so as to be one as shown in FIG. 21A or 21B. As a result, the interference peaks are distributed with a higher degree of uniformity over the substrate. In FIGS. 20A–20B and 21A–21B, the inclination is drawn in an exaggerated manner.

As mentioned above, it is more proper to vary an angle y that is formed by the scanning direction of the linear laser beam and the width direction thereof as shown in FIG. 8 in a range of $|\tan y| \leq 0.1$.

By utilizing the invention, the uniformity in the irradiation surface of the effect of laser annealing that is performed by using a laser beam that is uniformized through division and recombination can greatly be improved.

The invention can be applied to not only the laser annealing technique but also techniques in which a large-area object needs to be irradiated with laser light, such as an exposure technique that uses laser light.

What is claimed is:

1. A laser irradiation apparatus having a beam homogenizer, said beam homogenizer comprising:
   at least a cylindrical lens group having a parallelogram shape; and
   at least a cylindrical lens
   wherein one of interior angles of said parallelogram is in a range of 30° to 89°.

2. A laser irradiation apparatus comprising:
   a cylindrical lens group having a parallelogram shape,
   wherein said cylindrical lens group being formed by obliquely translating
      a lens shape that is formed by a parabola and a straight line, or
      a lens shape capable of focusing parallel rays having a particular wavelength in a two-dimensional space at one point,
   wherein one of interior angles of said parallelogram is in a range of 30° to 89°.

3. A laser irradiation apparatus comprising a cylindrical lens group including a plurality of cylindrical lenses, each of said cylindrical lenses being formed by translating a predetermined sectional shape to a predetermined direction, wherein:
   said cylindrical lens group is inserted in an optical path of a laser light;
   said sectional shape can focus parallel rays having a particular wavelength in a two-dimensional space at one point; and
   a line that is a collection of focal points of each of said cylindrical lenses is contained in a plane that is perpendicular to the optical path of said laser light, and is not perpendicular to a plane that contains said sectional shape.

4. An apparatus according to claim 3 wherein an angle formed by said line that is a collection of focal points of each of said cylindrical lenses and said plane containing said sectional shape is in a range of 30° to 89°.

5. An apparatus according to claim 3 wherein an angle formed by said line that is a collection of focal points of each of said cylindrical lenses and said plane containing said sectional shape is in a range of 45° to 87°.

6. A laser irradiation apparatus comprising a cylindrical lens group including a plurality of cylindrical lenses each of said cylindrical lenses being formed by translating a predetermined sectional shape to a predetermined direction, wherein:
- said cylindrical lens group is inserted in an optical path of a laser light;
- said sectional shape can focus parallel rays having a particular wavelength in a two-dimensional space at one point;
- a line that is a collection of focal points of each of said cylindrical lenses is contained in a plane that is perpendicular to the optical path of said laser light, and is not perpendicular to a plane that contains said sectional shape; and
- said lines that are collections of focal points of the respective cylindrical lenses are parallel with each other.

7. An apparatus according to claim 6 wherein an angle formed by said line that is a collection of focal points of each of said cylindrical lenses and said plane containing said sectional shape is in a range of 30° to 89°.

8. An apparatus according to claim 6 wherein an angle formed by said line that is a collection of focal points of each of said cylindrical lenses and said plane containing said sectional shape is in a range of 45° to 87°.

9. A laser irradiation apparatus for irradiating with a linear laser beam, said apparatus comprising:
- a generating means to generate a laser beam;
- a movable table that is movable in one direction;
- a first beam homogenizer comprising;
  - a first cylindrical lens group including a plurality of first cylindrical lenses,
  - wherein said first cylindrical lens group can divide said original laser beam in a longitude direction of said linear laser beam,
  - a second cylindrical lens,
  - wherein said second cylindrical lens can collect said divided laser beam in said longitude direction,
- a second beam homogenizer comprising;
  - a second cylindrical lens group including a plurality of third cylindrical lenses,
  - wherein said second cylindrical lens group can divide said original laser beam in a width direction of said linear laser beam,
  - a fourth cylindrical lens,
  - wherein said fourth cylindrical lens can collect said divided laser beam in said width direction, and
- a fifth cylindrical lens to focus said collected laser beam into said linear laser beam,
- wherein each of said first cylindrical lenses has a first bottom view of a first parallelogram which includes a first longer side and a first shorter side,
- wherein said first cylindrical lenses are arranged in parallel where said first longer sides of said first cylindrical lenses are in contact with each other so that said first cylindrical lens group has a second bottom view of a second parallelogram,
- wherein said second parallelogram has an interior angle X, and said interior angle X of said parallelogram is in a range of 30° to 89°.

10. An apparatus according to claim 9 wherein said laser beam is an excimer laser.

11. A laser irradiation apparatus for irradiating with a linear laser beam, said apparatus comprising:
- generating means to generate a laser beam;
- a movable table that is movable in one direction;
- a beam homogenizer comprising;
  - a first cylindrical lens group including a plurality of first cylindrical lenses,
  - wherein said first cylindrical lens group can divide said original laser beam in a longitude direction of said linear laser beam,
  - a second cylindrical lens,
  - wherein said second cylindrical lens can collect said divided laser beam in said longitude direction,
  - a third cylindrical lens to focus said collected laser beam into said linear laser beam,
- wherein each of said first cylindrical lenses has a first bottom view of a first parallelogram which includes a first longer side and a first shorter side,
- wherein said first cylindrical lenses are arranged in parallel where said first longer sides of said first cylindrical lenses are in contact with each other so that said first cylindrical lens group has a second bottom view of a second parallelogram,
- wherein said second parallelogram has an interior angle X, and said interior angle X of said parallelogram is in a range of 30° to 89°.

12. An apparatus according to claim 11 wherein said laser beam is an excimer laser.

13. A laser irradiation apparatus for irradiating with a linear laser beam, said apparatus comprising:
- a generating means to generate a laser beam;
- a movable table having a variable moving direction;
- a first beam homogenizer comprising;
  - a first cylindrical lens group including a plurality of first cylindrical lenses,
  - wherein said first cylindrical lens group can divide said original laser beam in a longitude direction of said linear laser beam,
  - a second cylindrical lens,
  - wherein said second cylindrical lens can collect said divided laser beam in said longitude direction,
- a second beam homogenizer comprising;
  - a second cylindrical lens group including a plurality of third cylindrical lenses,
  - wherein said second cylindrical lens group can divide said original laser beam in a width direction of said linear laser beam,
  - a fourth cylindrical lens,
  - wherein said fourth cylindrical lens can collect said divided laser beam in said width direction, and
- a fifth cylindrical lens to focus said collected laser beam into said linear laser beam,
- wherein each of said first cylindrical lenses has a first bottom view of a first parallelogram which includes a first longer side and a first shorter side,
- wherein said first cylindrical lenses are arranged in parallel where said first longer sides of said first cylindrical lenses are in contact with each other so that said first cylindrical lens group has a second bottom view of a second parallelogram,
- wherein said second parallelogram has an interior angle X, and said interior angle X of said parallelogram is in a range of 30° to 89°.

14. An apparatus according to claim 13 wherein said laser beam is an excimer laser.

15. An laser irradiation apparatus for irradiating with a linear laser beam, said apparatus comprising:
- a generating means to generate a laser beam;
- a movable table having a variable moving direction;
- a beam homogenizer comprising;
  - a first cylindrical lens group including a plurality of first cylindrical lenses,
  - wherein said first cylindrical lens group can divide said original laser beam in a longitude direction of said linear laser beam,
  - a second cylindrical lens,
  - wherein said second cylindrical lens can collect said divided laser beam in said longitude direction,
- a third cylindrical lens to focus said collected laser beam into said linear laser beam,
- wherein each of said first cylindrical lenses has a first bottom view of a first parallelogram which includes a first longer side and a first shorter side,
- wherein said first cylindrical lenses are arranged in parallel where said first longer sides of said first cylindrical lenses are in contact with each other so that said first cylindrical lens group has a second bottom view of a second parallelogram,
- wherein said second parallelogram has an interior angle X, and said interior angle X of said parallelogram is in a range of 30° to 89°.

16. An aparatus according to claim 15 wherein said laser beam is an excimer laser.

17. A laser irradiation apparatus for irradiating with a linear laser beam, said apparatus comprising:
- a generating means to generate an original laser beam;
- a first beam homogenizer comprising;
  - a first cylindrical lens group including a plurality of first cylindrical lenses,
  - wherein said first cylindrical lens group can divide said original laser beam in a longitude direction of said linear laser beam,
  - a second cylindrical lens,
  - wherein said second cylindrical lens can collect said divided laser beam in said longitude direction,
- a second beam homogenizer comprising;
  - a second cylindrical lens group including a plurality of third cylindrical lenses,
  - wherein said second cylindrical lens group can divide said original laser beam in a width direction of said linear laser beam,
  - a fourth cylindrical lens,
  - wherein said fourth cylindrical lens can collect said divided laser beam in said width direction, and
- a fifth cylindrical lens to focus said collected laser beam into said linear laser beam,
- wherein each of said first cylindrical lenses has a first bottom view of a first parallelogram which includes a first longer side and a first shorter side,
- wherein said first cylindrical lenses are arranged in parallel where said first longer sides of said first cylindrical lenses are in contact with each other so that said first cylindrical lens group has a second bottom view of a second parallelogram,
- wherein said second parallelogram has an interior angle X, and said interior angle X of said parallelogram is in a range of 30° to 89°, and
- wherein said linear laser beam scans in a scanning direction.

18. An apparatus according to claim 17 wherein said scanning direction is parallel to said width direction of said linear laser beam.

19. An apparatus according to claim 17 wherein an angle Y is defined between said scanning direction and said width direction of said linear laser beam,
- wherein said angle Y is in a range of $|\tan Y| \leq 0.1$.

20. A laser irradiation apparatus for irradiating with a linear laser beam, said apparatus comprising:
- a generating means to generate an original laser beam;
- a beam homogenizer comprising:
  - a first cylindrical lens group including a plurality of first cylindrical lenses,
  - wherein said first cylindrical lens group can divide said original laser beam in a longitude direction of said linear laser beam,
  - a second cylindrical lens,
  - wherein said second cylindrical lens can collect said divided laser beam in said longitude direction,
- a laser light shield plate; and
- a third cylindrical lens to focus said collected laser beam into said linear laser beam,
- wherein each of said first cylindrical lenses has a first bottom view of a first parallelogram which includes a first longer side and a first shorter side,
- wherein said first cylindrical lenses are arranged in parallel where said first longer sides of said first cylindrical lenses are in contact with each other so that said first cylindrical lens group has a second bottom view of a second parallelogram,
- wherein said second parallelogram has an interior angle X, and said interior angle X of said parallelogram is in a range of 30° to 89°, and
- wherein said linear laser beam scans in a scanning direction.

21. An apparatus according to claim 20 wherein said scanning direction is parallel to said width direction of said linear laser beam.

22. An apparatus according to claim 20 wherein an angle Y is defined between said scanning direction and said width direction of said linear laser beam,
- wherein said angle Y is in a range of $|\tan Y| \leq 0.1$.

* * * * *